United States Patent
Matsumoto et al.

(10) Patent No.: US 7,829,836 B2
(45) Date of Patent: Nov. 9, 2010

(54) DIGITAL SIGNAL INPUT DEVICE AND METHOD OF CONTROLLING THE SAME HAVING A SWITCHING ELEMENT THAT CONTROLS A PERIOD OF APPLYING DIRECT-CURRENT VOLTAGE TO A CHARGING CIRCUIT

(75) Inventors: Tomoyoshi Matsumoto, Chiyoda-ku (JP); Shigeto Oda, Chiyoda-ku (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 146 days.

(21) Appl. No.: 12/246,512

(22) Filed: Oct. 7, 2008

(65) Prior Publication Data
US 2009/0256606 A1 Oct. 15, 2009

(30) Foreign Application Priority Data
Apr. 14, 2008 (JP) ............................. 2008-104967

(51) Int. Cl.
*H01J 40/14* (2006.01)
(52) U.S. Cl. .............................. 250/214 R; 250/214 LS
(58) Field of Classification Search ............. 250/214 R, 250/214 LS, 214 DC, 214 SW; 327/514–516, 327/172; 320/132–134, 150–152, 160, 112
See application file for complete search history.

(56) References Cited

U.S. PATENT DOCUMENTS

| 6,525,542 | B2 | 2/2003 | Price |
| 7,045,990 | B2 * | 5/2006 | Takimoto et al. ............ 320/134 |

FOREIGN PATENT DOCUMENTS

| JP | 58-004403 A | 1/1983 |
| JP | 58-019031 A | 2/1983 |
| JP | 59-146305 A | 8/1984 |
| JP | 64-049978 A | 2/1989 |
| JP | 1-237702 A | 9/1989 |
| JP | 3-271818 A | 12/1991 |
| JP | 2002-084169 A | 3/2002 |

* cited by examiner

*Primary Examiner*—Que T Le
(74) *Attorney, Agent, or Firm*—Buchanan Ingersoll & Rooney PC

(57) ABSTRACT

A digital signal input device has a first input terminal and a second input terminal, a charging circuit connected between the first input terminal and the second input terminal, and a digital signal detection unit that outputs a digital signal of a logical value corresponding to a level of a charging voltage to an internal circuit. A pulse control unit generates a pulse signal having a fixed period using designated pulse width and pulse period. A switching element is provided between the charging circuit and the first input terminal or the second input terminal, which controls a period of applying a DC voltage to the charging circuit using a pulse width of the pulse signal.

9 Claims, 13 Drawing Sheets

DIGITAL SIGNAL INPUT DEVICE AND METHOD OF CONTROLLING THE SAME HAVING A SWITCHING ELEMENT THAT CONTROLS A PERIOD OF APPLYING DIRECT-CURRENT VOLTAGE TO A CHARGING CIRCUIT

BACKGROUND OF THE INVENTION

1. Field of the Invention

The present invention relates to a digital signal input device that converts an input direct-current voltage into a digital signal, and more particularly, to a digital signal input device suitable for using at an electrical station such as a substation.

2. Description of the Related Art

A digital signal input device includes a charging circuit arranged between a first input terminal and a second input terminal capable of inputting a direct-current (DC) voltage, and a digital signal detection unit that outputs a logical value "1" to an internal circuit when a charging voltage of the charging circuit exceeds a predetermined level, and outputs a digital signal of a logical value "0" to the internal circuit when the charging voltage of the charging circuit is below predetermined level. The whole of the charging circuit and the digital signal detection unit can be referred to as a so-called input circuit for the internal circuit. For ease of description, the word "input circuit" is used in the following to refer to the whole of the charging circuit and the digital signal detection unit.

A conventional digital signal input device is shown, for example, in FIG. 3 of Japanese Patent Application Laid-open No. 2002-84169. In the conventional digital signal input device, the input circuit is shown as a digital signal input unit.

The charging circuit is constituted by a current limiting resistor and a noise-filtering CR filter connected in series across an input terminal (in the following, the input terminal in this connection mode is, for example, referred to as a "first terminal") connected to a positive terminal of a power supply via a switch and an input terminal (in the following, the input terminal in this connection mode is referred to as, for example, a "second terminal") connected to a negative terminal of the power supply. The CR filter is a circuit of a capacitor and resistor connected in parallel.

When a DC voltage is applied across the first input terminal and the second input terminal at the circuit where the current limiting resistor and the CR filter are connected in series, a capacitor constituting the CR filter is charged according to a time constant at the series circuit. On the other hand, when a DC voltage is not applied across the first input terminal and the second input terminal, the electric discharge is carried out according to a time constant for a closed circuit of the capacitor and the resistor constituting the CR filter.

The digital signal detection unit is constructed so that at the digital signal input unit, a Zener diode, and a built-in light-emitting diode (LED) of an insulating photocoupler are arranged in series across the ends of the CR filter. A built-in phototransistor of the insulating photocoupler then outputs a digital signal ("1", "0") to the internal circuit. With this configuration, the sum of an on-operating voltage of the Zener diode and an on-operating voltage of the insulating photocoupler is provided as a detection level for the charging voltage at the charging circuit.

Taking the case of an electrical station such as a substation, this type of digital signal input device converts the states of a plurality of items of equipment connected to the same DC control power supply installed at the electrical station into a digital signal of logical values of "1" and "0" using the DC control power supply. The digital signal is then incorporated into a control panel and the like.

The input circuit at the digital signal input device used at the electrical station includes a plurality of first input terminals provided using a one-to-one relationship with a plurality of switches connected in parallel at the positive electrode of the DC control power supply and a second input terminal connected to the negative electrode of the DC control power supply. The input circuits of the same circuit are provided so that one input terminal is connected to terminals corresponding to a plurality of first input terminals and the other input terminal is connected to a common second input terminal.

With the input circuit of the conventional digital signal input device, a current limiting resistor and a Zener diode generate heat by a drive current for emitting light at a built-in LED of the insulating photocoupler. When the drive current flows in the same period at the plurality of input circuits arranged in parallel, a considerable amount of heat is generated.

In order to solve the problem of heat generation, in Japanese Patent Application Laid-open No. 2002-84169, as shown in FIG. 1, a time-division phototransistor is connected in parallel with just the number of the first input terminals to a single insulating phototransistor via a Zener diode and a CR filter. Each time-division phototransistor is then selectively turned on by a time-division control signal. The DC voltage applied to each first input terminal is then converted into a digital signal using time-division. If the digital signal input device used at the electrical station adopts this configuration, a pulse current flows for a short time at the current limiting resistor and the Zener diode. The heat generation can then be considerably reduced.

However, with the digital signal input devices used at electrical stations, there are also problems that cannot be dealt with using the configuration shown in Japanese Patent Application Laid-open No. 2002-84169 (FIG. 1) in addition to the heat generation.

DC control power supplies of a wide variety of voltages such as DC 48 volts, DC 110 volts, and DC 220 volts are used at electrical stations. The digital signal input device used at the electrical station needs to satisfy various requirements stipulated in the electrical standard JEC-2500 and the like for protective relays for electrical power use. Such requirements include, for example, detecting "voltage input present" when the input DC voltage is within a rated voltage fluctuation range. The requirements also include detecting "voltage input present" for one rated voltage and detecting "no voltage input" for another rated voltage when a DC voltage of the same value is a determination target for two different rated voltages of ranges of voltage fluctuation that do not overlap.

In addition to countermeasures for suppressing the heat generation, it is necessary for digital signal input devices used at electrical stations to make conversions into digital signals correctly according to DC voltages of different values and according to the requirements.

Regarding this problem, it is necessary to appropriately set the value of a current limiting resistor and the time constant of a CR filter according to different rated voltages and according to the requirements for a detection level decided by the sum of a Zener voltage of a Zener diode and an on-operation voltage of an insulating photocoupler. It is therefore difficult to achieve this with input circuits of the same configuration.

For this reason, input circuits of conventional digital signal input devices used at electrical stations have different configurations for every voltage of the DC control power supply installed at the electrical station. The input circuit selects elements that are resistant to the power consumed according to the corresponding DC voltage for the current limiting resistors and Zener diodes for every voltage of the DC control power supplies installed at the electrical station. The insulating photocouplers are also selected as necessary and the values of the current limiting resistors and the time constants of the CR filters are decided according to the corresponding DC voltages.

SUMMARY OF THE INVENTION

It is an object of the present invention to at least partially solve the problems in the conventional technology.

According to an aspect of the present invention, there is provided a digital signal input device having a first input terminal, a second input terminal, a charging circuit, and a digital signal detection unit. A direct-current voltage is applied across the first input terminal and the second input terminal. The charging circuit is connected between the first input terminal and the second input terminal. The digital signal detection unit detects a level of a charging voltage of the charging circuit and outputting a digital signal of a logical value according to whether the level of the charging voltage exceeds a predetermined level to an internal circuit. The digital signal input device further includes a pulse control unit that outputs a pulse signal having a fixed period using a designated pulse width and a designated pulse period; and a switching element that is provided between the charging circuit and either one of the first input terminal and the second input terminal, and that controls a period of applying the direct-current voltage to the charging circuit using a pulse width of the pulse signal.

Furthermore, according to another aspect of the present invention, there is provided a digital signal input device having a first input terminal, a second input terminal, a charging circuit, and a digital signal detection unit. A direct-current voltage is applied across the first input terminal and the second input terminal. The charging circuit is connected between the first input terminal and the second input terminal. The digital signal detection unit detects a level of a charging voltage of the charging circuit and outputting a digital signal of a logical value according to whether the level of the charging voltage exceeds a predetermined level to an internal circuit. The digital signal input device further includes a pulse control unit that performs, upon receiving a voltage configuration mode instruction, a processing to broaden a pulse width of a pulse signal output in a fixed period by a unit width at each pulse period, and upon receiving a notification of input detection, outputs a pulse signal having a pulse width adjusted until the notification of input detection is received; a switching element that is provided between the charging circuit and either one of the first input terminal and the second input terminal, and that controls a period of applying the direct-current voltage to the charging circuit using a pulse width of the pulse signal; a signal receiving unit that reads in an output of the digital signal detection unit in response to the pulse signal input in a fixed period and holds an output pulse for one pulse period; and a management unit that issues the notification of input detection when a digital signal of a logical value predetermined by the signal receiving unit is held, calculates a voltage value corresponding to the pulse width notified by the pulse control unit based on a time constant of the charging circuit, and stores the voltage value in the storage unit.

Moreover, according to still another aspect of the present invention, there is provided a digital signal input device having a first input terminal, a second input terminal, a charging circuit, and a digital signal detection unit. A direct-current voltage is applied across the first input terminal and the second input terminal. The charging circuit is connected between the first input terminal and the second input terminal. The digital signal detection unit detects a level of a charging voltage of the charging circuit and outputting a digital signal of a logical value according to whether the level of the charging voltage exceeds a predetermined level to an internal circuit. The digital signal input device further includes a pulse control unit that outputs, upon receiving a pulse width adjustment mode instruction, a pulse signal output in a fixed period having a pulse width adjusted according to the pulse width adjustment instruction; a switching element that is provided between the charging circuit and either one of the first input terminal and the second input terminal, and that controls a period of applying the direct-current voltage to the charging circuit using a pulse width of the pulse signal; a signal receiving unit that reads in an output of the digital signal detection unit in response to the pulse signal input in a fixed period and holds an output pulse for one pulse period; and a management unit that repeatedly issues, when a logical value of a digital signal held by the signal receiving unit is not a logical value predetermined for the direct-current voltage applied across the first input terminal and the second input terminal, the pulse width adjustment instruction in which an adjustment width is specified until the digital signal of the predetermined logical value is held by the signal receiving unit, and when holding of the digital signal of the predetermined logical value is confirmed, stores the pulse width in the storage unit.

Furthermore, according to still another aspect of the present invention, there is provided a control method for a digital signal input device having a first input terminal, a second input terminal, a charging circuit, and a digital signal detection unit. A direct-current voltage is applied across the first input terminal and the second input terminal. The charging circuit is connected between the first input terminal and the second input terminal. The digital signal detection unit detects a level of a charging voltage of the charging circuit and outputting a digital signal of a logical value according to whether the level of the charging voltage exceeds a predetermined level to an internal circuit. The control method includes storing in advance a pulse width and a pulse period calculated from a correlation between a time constant of the charging circuit and the predetermined level, for an applied direct-current voltage in a storage unit; reading out the pulse width and the pulse period from the storage unit for the direct-current voltage applied across the first input terminal and the second input terminal; outputting a pulse signal having a fixed period using the pulse width and the pulse period read at the reading; and controlling a period of applying the direct-current voltage to the charging circuit using a pulse width of the pulse signal.

Moreover, according to still another aspect of the present invention, there is provided a control method for a digital signal input device having a first input terminal, a second input terminal, a charging circuit, and a digital signal detection unit. A direct-current voltage is applied across the first input terminal and the second input terminal. The charging circuit is connected between the first input terminal and the second input terminal. The digital signal detection unit detects a level of a charging voltage of the charging circuit and outputting a digital signal of a logical value according to whether the level of the charging voltage exceeds a predetermined level to an internal circuit. The control method includes executing a processing to broaden a pulse width of a pulse signal output in a fixed period by a unit width at each pulse period until an input of a digital signal of a predetermined logical value is detected in a voltage configuration mode; controlling a period of applying the direct-current voltage to the charging circuit using a pulse width of the pulse signal; reading in an output of the digital signal detection unit in response to the pulse signal input; holding an output pulse for one pulse period; detecting the input of the digital signal when the digital signal of the logical value predetermined at the reading is held; acquiring the pulse width processed at the executing; calculating a voltage value corresponding to the pulse width acquired at the acquiring based on the time constant of the charging circuit; and storing the voltage value in a storage unit.

Furthermore, according to still another aspect of the present invention, there is provided a control method for a digital signal input device having a first input terminal, a second input terminal, a charging circuit, and a digital signal detection unit. A direct-current voltage is applied across the first input terminal and the second input terminal. The charging circuit is connected between the first input terminal and the second input terminal. The digital signal detection unit detects a level of a charging voltage of the charging circuit and outputting a digital signal of a logical value according to whether the level of the charging voltage exceeds a predetermined level to an internal circuit. The control method includes applying a predetermined direct-current voltage across the first input terminal and the second input terminal; outputting a pulse width adjustment instruction in which a correction pulse width is specified in a pulse width adjustment mode; outputting a pulse signal output in a fixed period having a pulse width adjusted according to the pulse width adjustment instruction; controlling a period of applying the direct-current voltage to the charging circuit using a pulse width of the pulse signal; reading in an output of the digital signal detection unit in response to the pulse signal input in a fixed period; holding an output pulse for one pulse period; determining whether a logical value of a digital signal held at the holding is a logical value predetermined for the direct-current voltage applied across the first input terminal and the second input terminal; issuing repeatedly, when the logical value of the digital signal held at the holding is not a logical value predetermined for the direct-current voltage applied across the first input terminal and the second input terminal, the pulse width adjustment instruction in which an adjustment width is specified until the digital signal of the predetermined logical value is held at the holding; and storing the pulse width in the storage unit when holding of the digital signal of the predetermined logical value is confirmed.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of the present invention are explained in detail below with reference to the accompanying drawings.

Figure 1:
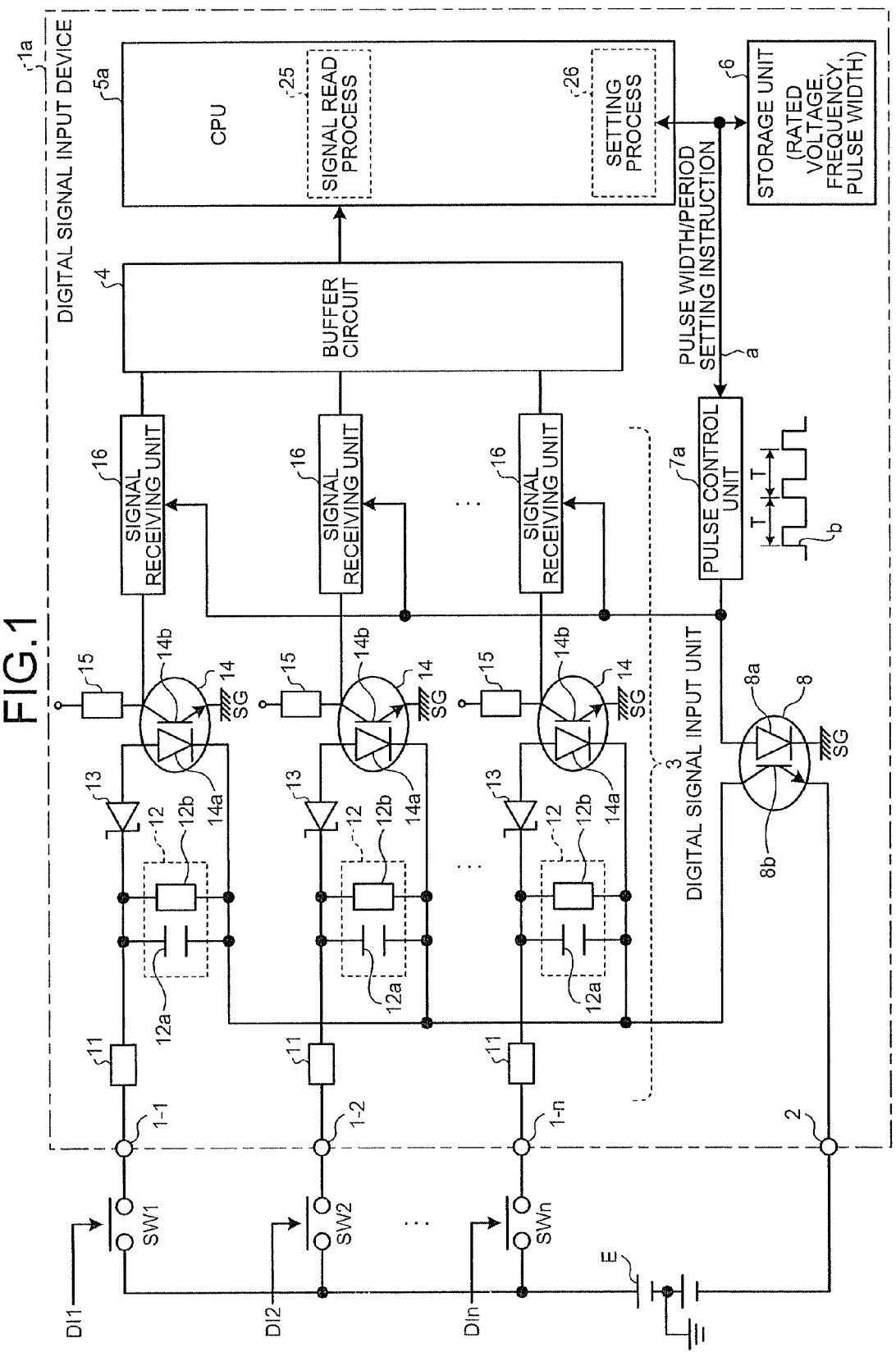
FIG. 1 is a block diagram of a digital signal input device according to a first embodiment of the present invention.

FIG. 1 is a block diagram of a digital signal input device 1a according to a first embodiment of the present invention.

In FIG. 1, a direct-current (DC) power supply E and switches SW1 to SWn are not provided at the digital signal input device 1a, but rather are provided at the actual location where the digital signal input device 1a is provided (in this case, an electrical station such as a transformer station).

The DC power supply E is a DC controlling power supply provided at an electrical station such as a transformer station. Various voltages such as DC 48 volts, DC 110 volts, or DC 220 volts can be used as the voltage for the DC power supply E. The voltage of the DC power supply E does not have to be the same at all electrical stations but rather can be different depending on the electrical station. As depicted in FIG. 1, there are also cases where the DC power supply E is installed with an earth connection provided at a central point of two power supplies connected in series to ensure a voltage at the time of earth failure.

One end of each of the n switches (SW1 to SWn) is connected in parallel to the positive terminal of the DC power supply E. The switches are then opened and closed by externally supplied binary level digital signals DI1 to DIn.

As shown in FIG. 1, the digital signal input device 1a of the first embodiment is provided with first input terminals 1-1 to 1-n capable of being connected to the other ends of the n switches (SW1 to SWn) as external input terminals and a second input terminal 2 capable of being connected to the negative electrode of the DC power supply E.

n digital signal input units 3 provided one for each of the first input terminals 1-1 to 1-n, a buffer circuit 4, a central processing unit (CPU) 5a (a control unit), a storage unit 6, a pulse control unit 7a, and an input control photocoupler 8 are also provided.

Figure 3:
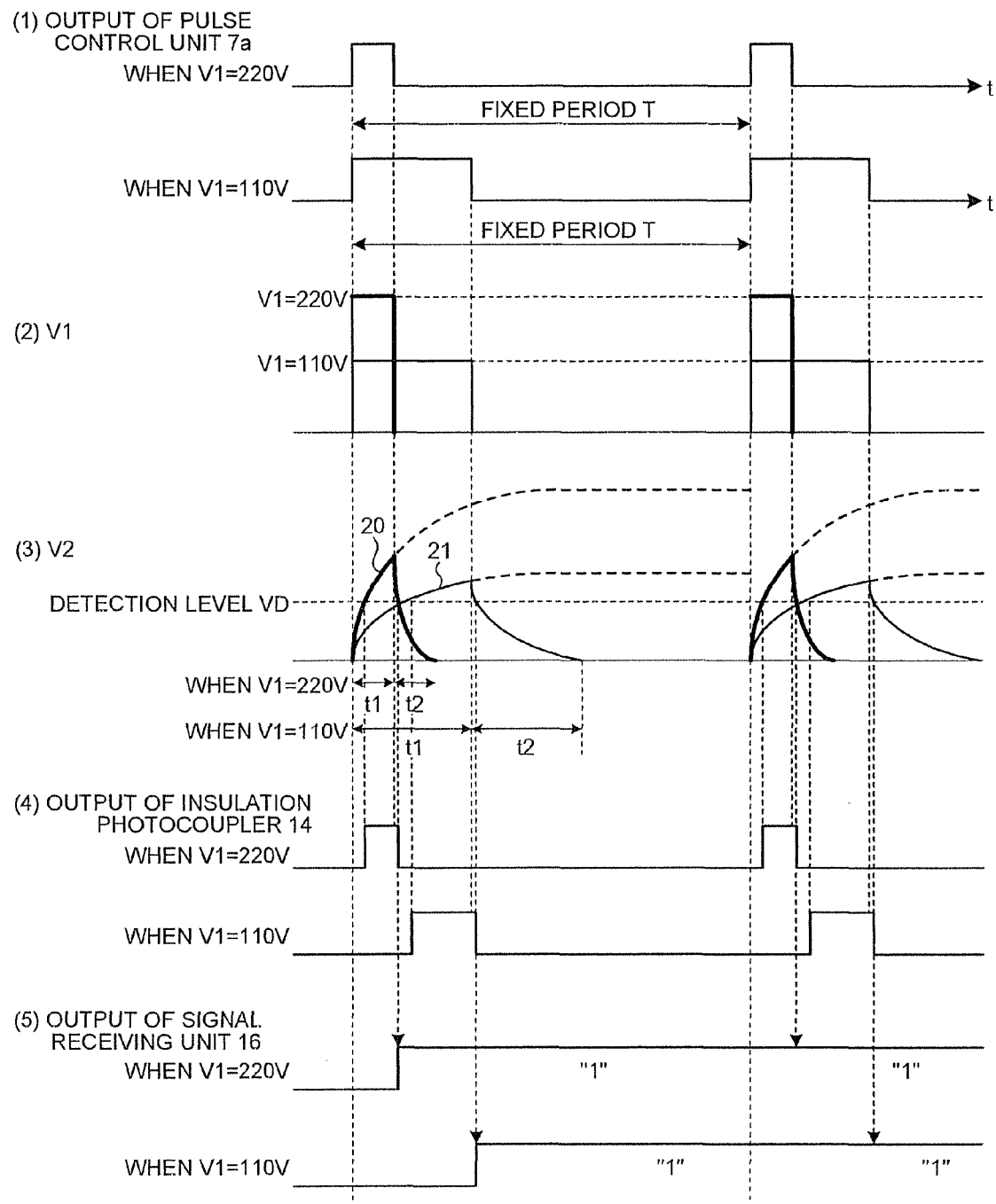
FIG. 3 is a timing chart of operation waveforms for each part of the circuit shown in FIG. 2.

The digital signal input units 3 are each provided with a current-limiting resistor 11, a noise-filtering CR filter 12 constituted by a circuit of a capacitor 12a and a resistor 12b connected in parallel, a Zener diode 13, an insulating photocoupler 14, and a signal receiving unit 16. This configuration for the digital signal input units 3 is shown in FIG. 3 of the Japanese Patent Application Laid-open No. 2002-84169 with the exception of the signal receiving unit 16.

The relationship of the connection of the first input terminals 1-1 to 1-n, the second input terminal 2, and the n digital signal input terminals 3 is shown in the example of the relationship of connections between the first input terminal 1-1 and the second input terminal 2. The first input terminal 1-1 is connected to an end of the CR filter 12 and a cathode terminal of the Zener diode 13 via the current-limiting resistor 11. An anode terminal of the Zener diode 13 is connected to the other terminal of the CR filter 12 and a collector terminal of a built-in phototransistor 8b of the input control photocoupler 8 of the first embodiment via a built-in light-emitting diode (LED) 14a of the insulating photocoupler 14. An emitter terminal of the built-in phototransistor 8b is connected to the second input terminal 2.

A collector terminal of a built-in phototransistor 14b of the insulating photocoupler 14 is connected to an operation power supply via a pull-up resistor 15 and is connected to the buffer circuit 4 via the signal receiving unit 16 according to this embodiment. An emitter terminal is connected to signal ground SG.

The built-in phototransistor 8b of the input control photocoupler 8 according to the first embodiment is connected in series to a circuit of the current-limiting resistor 11 and the CR filter 12 connected in series constituting the charging circuit. Both ends of the entire series circuit are then connected to the first input terminal 1-1 and the second input terminal 2. The circuit that is the Zener diode 13 and the insulating photocoupler 14 connected in series that constitutes the digital signal detection unit is arranged in parallel with the ends of the CR filter 12. As can be understood from this configuration, the built-in phototransistor 8b of the input control photocoupler 8 is provided across the second input terminal 2 and the CR filter 12 in FIG. 1 but can also be provided across the first input terminal 1-1 and the current-limiting resistor 11.

An anode terminal of a built-in LED 8a of the input control photocoupler 8 is connected to the output of the pulse control unit 7a of the first embodiment, and a cathode terminal is connected to the signal ground SG. The input control photocoupler 8 receives a pulse signal b for a fixed period T output by the pulse control unit 7a. The input control photocoupler 8 then goes on only within periods corresponding to pulse widths of each pulse signal b. As a result, control is exerted so that a path between another terminal of the CR filter 12, a cathode terminal of the built-in LED 14a of the insulating photocoupler 14, and the second input terminal 2 only conducts during periods where the built-in phototransistor 8b of the input control photocoupler 8 is on.

With the digital signal input units 3, a DC voltage is applied and charging occurs across the ends of the circuit of the current-limiting resistor 11 and the CR filter 12 connected in series to constitute the charging circuit only during the periods when the built-in phototransistor 8b of the input control photocoupler 8 is on. As a result, the charging voltage of the charging circuit is such that the time to reach a detection level defined by the sum of the Zener voltage of the Zener diode 13 and the on operation voltage of the insulating photocoupler 14 changes according to the on operation time of the built-in phototransistor 8b, i.e. changes according to the length of the pulse width of the pulse signal b.

The pulse control unit 7a is provided with a pulse signal generator and a control circuit for setting a pulse width and a pulse period a received from the CPU 5a at the pulse signal generator. As a result, the pulse control unit 7a outputs a pulse signal b of a fixed pulse width every fixed period T using a pulse width and pulse period a specified by the CPU 5a.

Each of the n signal receiving units 16 of the digital signal input units 3 includes a latch circuit. An output state from a collector terminal of the built-in phototransistor 14b of a corresponding insulating photocoupler 14 is read in on the trailing edge (a trailing edge in the example shown in the drawings) of a pulse signal b output by the pulse control unit 7a. The output state is then held for one pulse period T. However, as shown in FIG. 1, the output level of the collector terminal of the built-in phototransistor 14b is such that a signal level for logical value "1" is a low level of the potential of signal ground SG and the signal level of the logical value "0" is a high level of the operation power supply potential. An inverter circuit that inverts and captures the signal levels is therefore provided at an input stage of the latch circuit.

The buffer circuit 4 reads and stores digital signals ("1", "0") held in the n signal receiving units 16.

An setting process 26 in the CPU 5a is provided with carries out processing to store a DC voltage (i.e. rated voltage) applied to the digital signal input device 1a and a pulse width and frequency for this rated voltage (pulse period) input every type of voltage of the DC power supply E installed at the electrical station in the storage unit 6 as a result of a manual operation by an employee in an initial setting mode prior to shipping from the factory. It is also possible to use a storage unit in the CPU 5a is provided with as the storage unit 6.

When the DC voltage input to the digital signal input device 1a is decided and operation starts, the CPU 5a reads out a pulse width and a pulse period a at the rated voltage for the input DC voltage from the storage unit 6 and supplies the pulse width and the pulse period a to the pulse control unit 7a.

The CPU 5a executes a signal read process 25 and reads a digital signal from the buffer circuit 4. If the logical value of the digital signal is "1", then it is determined that a "voltage input is present". If the logical value is "0", then it is determined that there is "no voltage input". It is also possible to perform determination operations that satisfy each of the various requirements stipulated in the electrical standard JEC-2500 for a protective relay for power use.

For example, the following demands can be included in the requirements stipulated in the electrical standard JEC-2500.

For example, it is necessary for "voltage input present" to be detected when the voltage of the DC power supply E input when a certain switch is closed is within a range of fluctuation of the rated voltage of "+30% to −20%".

Further, as shown in FIG. 1, a requirement when the DC power supply E is two power supplies connected in series with earth taken from a point between the two power supplies is that when earth failure occurs at the first input terminal, the input voltage becomes ½, but in this event "voltage input present" should not be erroneously detected.

More specifically, the requirements for a rated voltage of DC 110 volts is to detect "voltage input present" in the voltage range of DC 88 volts to DC 143 volts and to always detect "no voltage input" for DC $143 \times ½ \approx 72$ volts or less.

The requirements for a rated voltage of DC 220 volts are to detect "voltage input present" in a voltage range of DC 176 volts to DC 286 volts, and to always detect "no voltage input" for DC 286×½≈143 volts or less.

With the two types of rated voltage for each of the voltage fluctuation ranges for DC 110 volts and DC 220 volts taken as an example, there is a contradictory requirement that an input DC voltage is the same DC 143 volts but with one rated voltage it is necessary for the voltage of DC 143 volts to be detected as "voltage input present", whereas with the other rated voltage, it is necessary for the voltage of DC 143 volts to be detected as "no voltage input".

In the first embodiment, it is possible to control the time taken to charge the capacitor 12a up to the detection level. It is therefore possible to suppress heat generated for a large number of types of DC voltages using input circuits of the same configuration (digital signal input units). Further, when a large number of types of DC voltages are accompanied by contradictory requirements as demonstrated in the above example, conversion into an appropriate digital signal where non-detection of voltages of ½ or less is possible. This is explained in detail in the following.

To illustrate the corresponding relationship of claim 1 and claim 2, the whole of a circuit that is the current-limiting resistor 11 and the CR filter 12 in series corresponds to the charging circuit. The whole of the Zener diode 13 and the insulating photocoupler 14 correspond to the digital signal detection unit. The input control photocoupler 8 corresponds to the switching element. The pulse control unit 7a corresponds to the pulse control unit. The CPU 5a corresponds to the management unit. The storage unit 6 corresponds to the storage unit.

Figure 2:
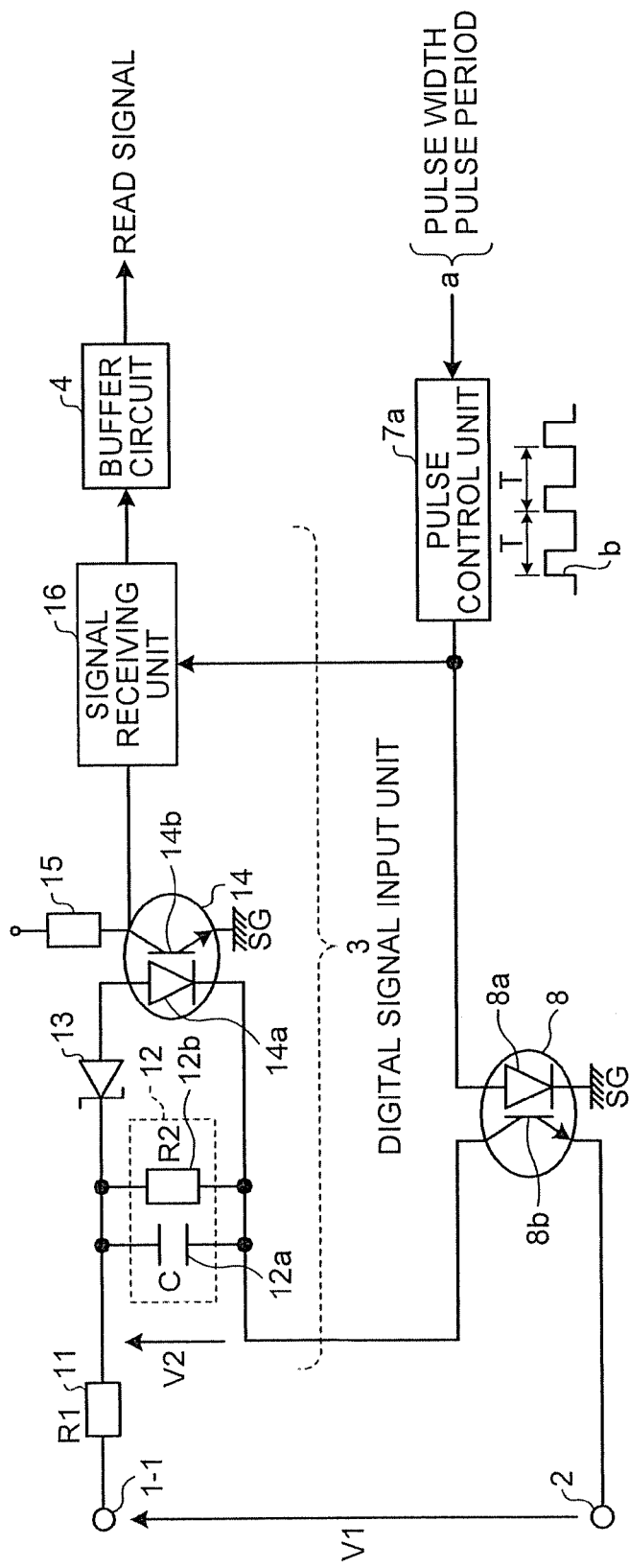
FIG. 2 is a circuit diagram illustrating the operation of single-input system of the digital signal input device shown in FIG. 1.
Figure 4:
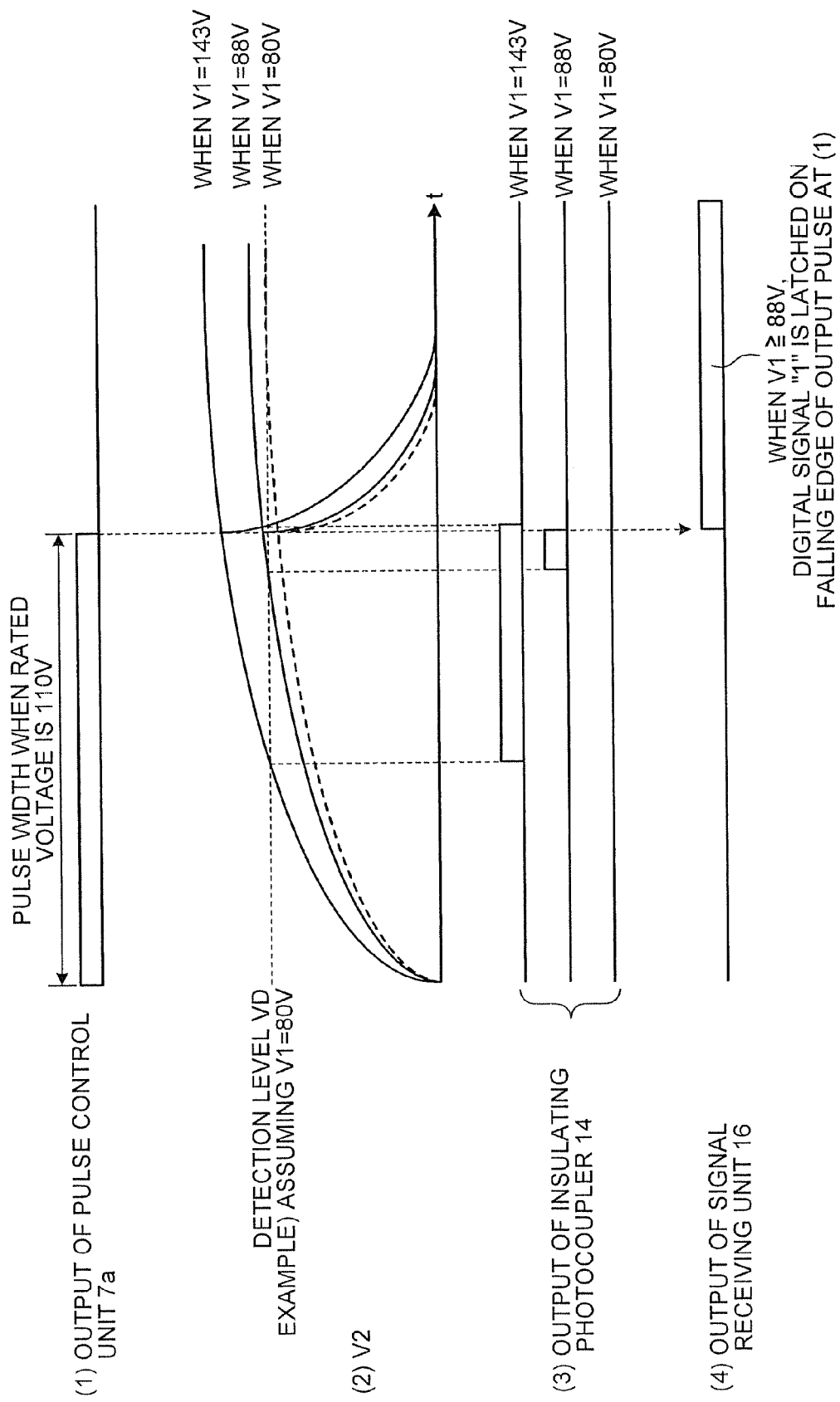
FIG. 4 is a timing chart of the operation (first part) when the DC voltage input at the circuit shown in FIG. 2 changes.
Figure 5:
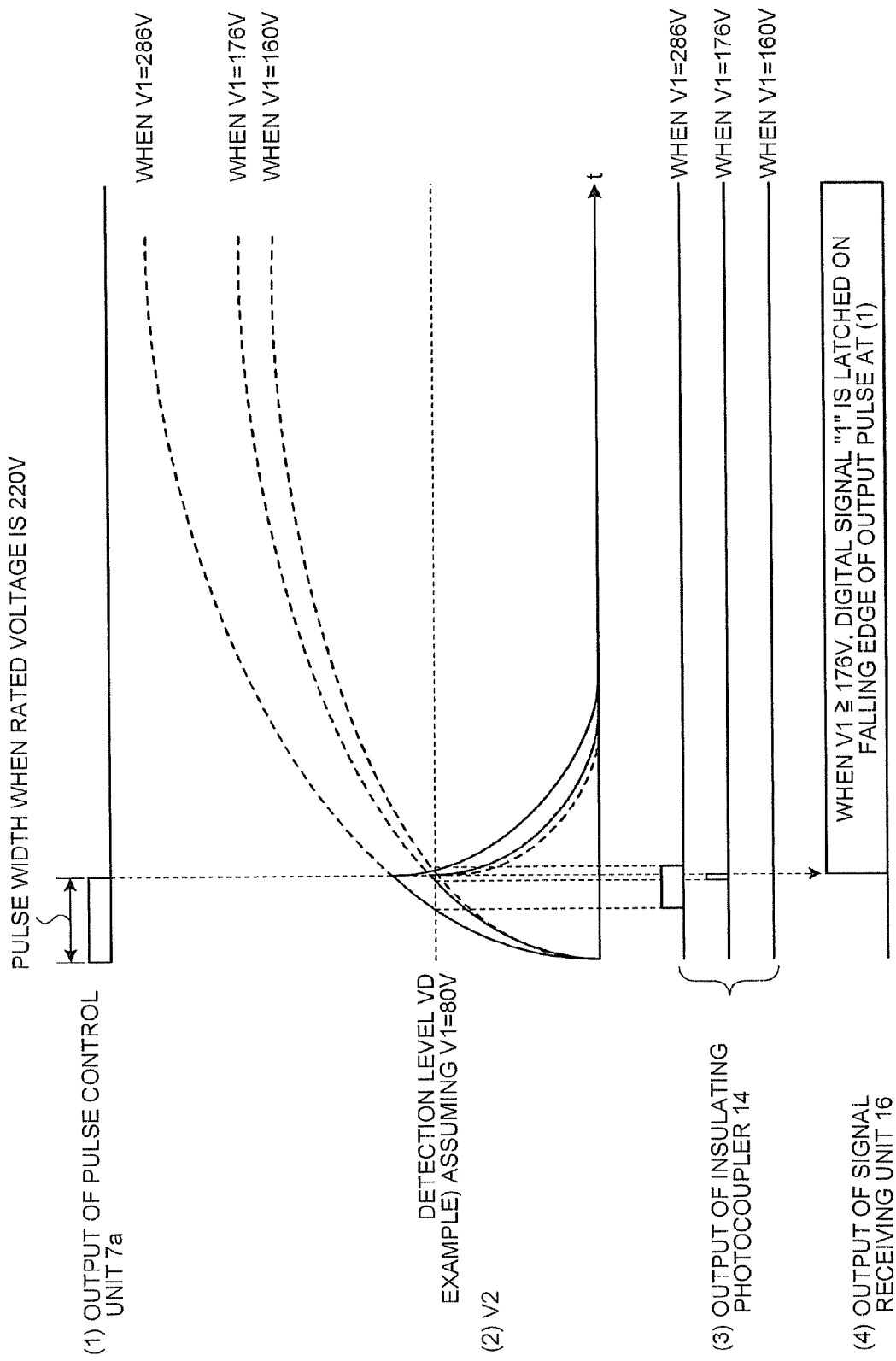
FIG. 5 is a timing chart of the operation (second part) when the DC voltage input at the circuit shown in FIG. 2 changes.

Next, a description is given of the operation of the digital signal input device 1a with reference to FIGS. 2 to 5. FIG. 2 is a circuit diagram illustrating the operation of single-input system of the digital signal input device 1a shown in FIG. 1. FIG. 3 is a timing chart showing operation waveforms for each part of the circuit shown in FIG. 2. FIG. 4 is a timing chart illustrating the operation (first of two) when the DC voltage input at the circuit shown in FIG. 2 changes. FIG. 5 is a timing chart illustrating the operation (second of two) when the DC voltage input at the circuit shown in FIG. 2 changes.

In FIG. 2, in a state where a DC voltage V1 is applied across the first input terminal 1-1 and the second input terminal 2, the pulse control unit 7a sets a pulse width and a pulse period a input by the CPU 5a at the built-in pulse signal generator. When a pulse signal b of an instructed pulse width is then output at a fixed period T, the input control photocoupler 8 goes on only during the period of the pulse width of the input pulse signal b. The DC voltage V1 is therefore applied to the ends of the circuit of the current-limiting resistor 11 and the CR filter 12 connected in series only within the period of the pulse width of the input pulse signal b. A voltage V2 that is obtained by dividing the DC voltage V1 by a resistance R1 of the current-limiting resistor 11 and a resistance R2 of the resistor 12b is applied across the ends of the CR filter 12.

As a result, a charging current flows to the capacitor 12a via the first input terminal 1-1, the current-limiting resistor 11, the CR filter 12, the built-in phototransistor 8b of the input control photocoupler 8, and the second input terminal 2. The terminal voltage of the CR filter 12 then rises towards the divided voltage V2 as the result of a charging operation obeying a CR time constant due to the resistance R1 of the current-limiting resistor 11, the capacitance C of the capacitor 12a, and the resistance R2 of the resistor 12b.

A situation where the charging voltage of the capacitor 12a that is a terminal voltage of the CR filter 12 in this case reaches the divided voltage V2 is denoted by Equation (1), where the time that has elapsed from application of the DC voltage V1 is taken to be "t".

$$V2(t) = V1 \times \frac{R2}{R1+R2}\left(1 - \text{EXP}\left(-\frac{R1+R2}{C \cdot R1 \cdot R2} \times t\right)\right)[V] \quad (1)$$

where a charging voltage V2(t) of the capacitor 12a generated by charging according to Equation (1) is applied across the ends of the circuit of the Zener diode 13 and the built-in LED 14a of the insulating photocoupler 14 connected in series.

When the charging voltage V2(t) exceeds a voltage causing the circuit of the Zener diode 13 and the built-in LED 14a of the insulating photocoupler 14 connected in series to go from an open to a closed state, i.e. exceed the detection level VD shown in Equation (2) within an elapsed time t (a time t1 corresponding to the pulse width), a digital signal of logical value "1" is output from the built-in phototransistor 14b of the insulating photocoupler 14.

$$VD = ZD + Vpc \quad (2)$$

When the voltage is not exceeded, a digital signal of logical value "0" is output from the built-in phototransistor 14b. In Equation (2), ZD is a Zener voltage of the Zener diode 13, and Vpc is an on voltage of the insulating photocoupler 14.

The signal receiving unit 16 reads in the output of the built-in phototransistor 14b on the trailing edge of the input pulse signal b and holds the output for a period until the next trailing edge of the pulse signal b. The digital signal of logical value "1" or logical value "0" held by the signal receiving unit 16 is stored in the buffer circuit 4 and is read-in by the CPU 5a as a result of execution of the signal read process 25.

Next, when the input control photocoupler 8 goes off on the trailing edge of the input pulse signal b, the charging path to the capacitor 12a no longer exists. Electrical discharge therefore takes place via a closed circuit constituting the capacitor 12a and the resistor 12b. Electrical discharge in this case is as denoted in Equation (3). In Equation (3), V2max is V2(t1) when the elapsed time t is t1 corresponding to the pulse width in Equation (2). Further, the elapsed time t is the elapsed time from V2max, and is a value different to the elapsed time t in Equation (1).

$$V2(t) = V2\text{max} \times \text{EXP}\left(-\frac{t}{C \cdot R2}\right)[V] \quad (3)$$

If the terminal voltage V2(t) of the CR filter 12 is smaller than the detection level VD due to this discharge, the insulating photocoupler 14 outputs a digital signal of logical value "0". Namely, if the terminal voltage V2(t) of the CR filter 12 is larger than the detection level VD after the elapsing of a time t1 corresponding to the pulse width, the insulating photocoupler 14 outputs a digital signal of logical value "1". If the time until the terminal voltage V2(t) falls to an extent that can be ignored after discharge in Equation (3) is taken to be t2, then the period T of the pulse signal b is decided so as to satisfy the relationship:

$$t1 + t2 \leq T \quad (4)$$

There are then various voltages for the DC control power supply at the electrical station supplying the DC voltage V1 such as DC 220 volts, DC 110 volts, and DC 48 volts. Upon respectively identifying and converting the voltages into digital signals, as can be understood from the above description, if R1, R2 and C are fixed, the pulse width of the pulse signal b output from the pulse control unit 7a can be adjusted such that the pulse width becomes short when the input DC voltage is high and long when the input DC voltage is low. It is then possible to calculate an appropriate value in advance every time a DC voltage is input. Namely, the pulse width and frequency (pulse period) are decided in this way for the DC voltage (rated voltage) stored in the storage unit 6.

Next, an example is given for two types of DC voltage, DC 220 volts and DC 110 volts in FIG. 3. An operation waveform for the circuit for the one system shown in FIG. 2 is shown.

FIG. 3 (1): The period T of the pulse signal b output by the pulse control unit 7a is the same fixed value whatever the voltage but the pulse width of the pulse signal b when V1=220 volts is shorter than the pulse width of the pulse signal b when V1=110 volts. As a result, the time of application of the DC voltage to the CR filter 12 is shorter when V1=220 volts and is longer when V1=110 volts.

FIG. 3 (3): The terminal voltage V2 of the CR filter 12 changes as shown by the characteristic curve 20 when V1=220 volts and changes as shown by a characteristic curve 21 when V1=110 volts. The terminal voltage V2 is at a maximum at the end of the on time of the pulse signal b output by the pulse control unit 7a and when this pulse signal goes off, the waveform follows a path of falling and then disappearing. For either of the voltages, the period T of the pulse signal is a time that is sufficiently longer than the sum of the time t1 until the maximum value is reached and the time t2 where a level of an order that can be ignored is reached for either voltage.

FIG. 3 (4): An output state of the insulating photocoupler 14 is shown as logically inverted but the insulating photocoupler 14 goes on only within the period from the terminal voltage V2 of the CR filter 12 exceeding the detection level VD to the time of falling and outputs a digital signal of a logical value of "1" for either voltage.

FIG. 3 (5): The signal receiving unit 16 reads in the output of the insulating photocoupler 14 on the trailing edge of the input pulse signal (FIG. 3 (1)) for either voltage and holds the output for a period until the next trailing edge of the pulse signal for either voltage.

Next, the operation for fulfilling the condition that "voltage input present" has to be detected in the voltage fluctuation range "+30% to −20% of rated voltage" of the DC control power supply stipulated in the electrical standard JEC-2500 for a protective relay for power use is explained referring to FIGS. 4 and 5. In FIGS. 4 and 5, (1) denotes the pulse width of the pulse signal b output by the pulse control unit 7a, (2) denotes the relationship of the terminal voltage V2 of the CR filter 12 and the detection level VD during charging at each DC voltage V1 within the voltage fluctuation range, (3) indicates the output state of the insulating photocoupler 14, and (4) indicates the output state of the signal receiving unit 16.

FIG. 4 shows an example operation at a rated voltage of DC 110 volts. The requirements for a rated voltage of DC 110 volts is to detect "voltage input present" in the voltage range of DC 88 volts to DC 143 volts and to always detect "no voltage input" for DC 143×½≈72 volts or less.

The pulse width at the time of a rated voltage of DC 110 volts shown in FIG. 4 (1) is decided as the time width the terminal voltage V2 of the CR filter 12 takes to reach the detection level VD when the input DC voltage V1 is V1=80 volts. In FIG. 4 (2), the case where the DC voltage V1 changes from V1=143 volts to V1=88 volts to V1=80 volts is shown. The detection level VD is, for example, V1=80 volts.

As shown in FIG. 4 (2), when V1=143 volts to V1=88 volts, the terminal voltage V2 of the CR filter 12 exceeds the detection level VD but when V1=80 volts or less, the terminal voltage V2 of the CR filter 12 does not reach the detection level VD. As shown in FIG. 4 (3), the insulating photocoupler 14 goes on in the voltage range of V1=143 volts to V1=88 volts but goes off when V1=80 volts or less.

As a result, as shown in FIG. 4 (4), the digital signal latching on the trailing edge of the pulse signal b input by the signal receiving unit 16 gives a digital signal of logical value "1" when V1≧88 volts and "voltage input present" can be detected. When V1=80 volts or less, the digital signal becomes a logical value of "0" and "no voltage input" can be detected.

FIG. 5 shows an example operation at a rated voltage of DC 220 volts. The requirements for a rated voltage of DC 220 volts are to detect "voltage input present" in the voltage range of DC 176 volts to DC 286 volts and to always detect "no voltage input" for DC 286×½≈143 volts or less.

The pulse width at the time of a rated voltage of DC 220 volts shown in FIG. 5(1) is decided as the time width the terminal voltage V2 of the CR filter 12 takes to reach the detection level VD when the input DC voltage V1 is V1=80 volts. In FIG. 5(2), the case where the DC voltage V1 changes from V1=286 volts to V1=176 volts to V1=160 volts is shown. The detection level VD is, for example, V1=80 volts.

As shown in FIG. 5(2), when V1=286 volts to V1=176 volts, the terminal voltage V2 of the CR filter 12 exceeds the detection level VD but when V1=160 volts or less, the detection level VD is not reached. As shown in FIG. 5(3), the insulating photocoupler 14 goes on in the voltage range of V1=286 volts to V1=176 volts but goes off when V1=160 volts or less.

As a result, as shown in FIG. 5(4), the digital signal latching on the trailing edge of the pulse b input by the signal receiving unit 16 gives a digital signal of logical value "1" when V1≧176 volts and "voltage input present" can be detected. When V1=160 volts or less, the digital signal becomes a logical value of "0" and "no voltage input" can be detected.

According to the first embodiment, a current path to a CR filter formed when a DC voltage is applied is closed by a pulse of a width that is short when the DC voltage is high but is long when the DC voltage is low. The path is then opened after the elapsing of a period of the pulse width. It is therefore possible to ensure that power consumed by the current limiting resistor and Zener diode does not increase substantially even when the DC voltage is high. It is therefore possible to provide compatibility with input circuits of the same configuration regardless of the magnitude of the DC voltage.

The time taken for the charging voltage of the CR filter to reach a detection level when a DC voltage is applied is decided using a pulse width that is short when the applied DC voltage is high and long when the applied DC voltage is low. It is therefore possible to provide a compatible input circuit with the same configuration without changing the current limiting resistor, the CR filter, the Zener diode and the insulating photocoupler according to the rated voltage even when a number of DC voltages are input.

A range of fluctuation of the DC voltage applied as the rated voltage is decided. It is then possible to decide a detection level midway between the "voltage input present" and "no voltage input" even when detection of "voltage input present" and "no voltage input" takes place according to the DC voltage. The pulse width is then decided in line with this detection level. It is then similarly possible to provide a compatible input circuit with the same configuration without changing the current limiting resistor, the CR filter, the Zener diode and the insulating photocoupler according to the rated voltage.

Figure 6:
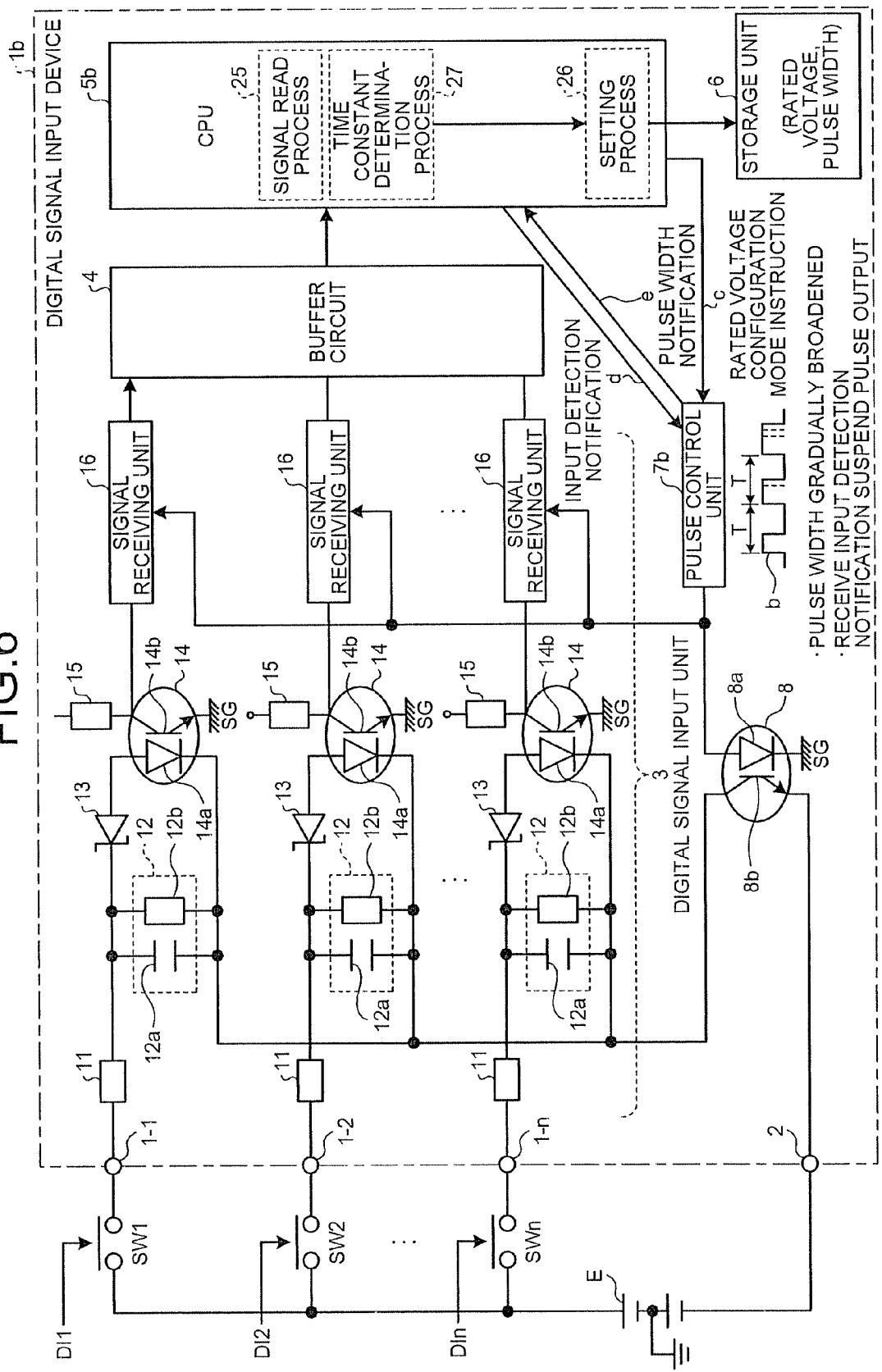
FIG. 6 is a block diagram of a digital signal input device according to a second embodiment of the present invention.

FIG. 6 is a block diagram of a digital signal input device according to a second embodiment of the present invention. In FIG. 6, elements of the configuration that are the same as or similar to elements of the configuration shown in FIG. 1 (the first embodiment) are given the same numerals. The explanation concentrates on portions relating to the second embodiment.

As shown in FIG. 6, a digital signal input device 1b of the second embodiment is the configuration shown in FIG. 1 (the first embodiment) with a CPU 5b provided in place of the CPU 5a and with a pulse control unit 7b provided in place of the pulse control unit 7a. A time constant determination process 27 is added at the CPU 5b.

In the first embodiment, the case where the rated voltage and the pulse width and pulse period for the rated voltage are stored in advance in the storage unit 6 is shown. However, in the second embodiment, the case is shown where this device is actually made to operate under an arbitrary predetermined rated voltage applied across an arbitrary first input terminal and second input terminal 2. The time constant determination process 27 then determines the time constant from the pulse width obtained at this time and decides the input rated voltage. The decided rated voltage is then stored in the storage unit 6 together with the pulse width. The CPU 5b is equipped with a rated voltage configuration mode as an operation mode for controlling this operation.

Upon receiving the rated voltage configuration mode instruction c from the CPU 5b, the pulse control unit 7b makes the pulse width of the pulse signal b output in the fixed period T gradually longer from a short pulse width set in advance in unit widths until the input detection notification d is received from the CPU 5b. Upon receiving the input detection notification d, the pulse output is stopped, and the CPU 5b is notified of the pulse width e adjusted up to this point.

Figure 7:
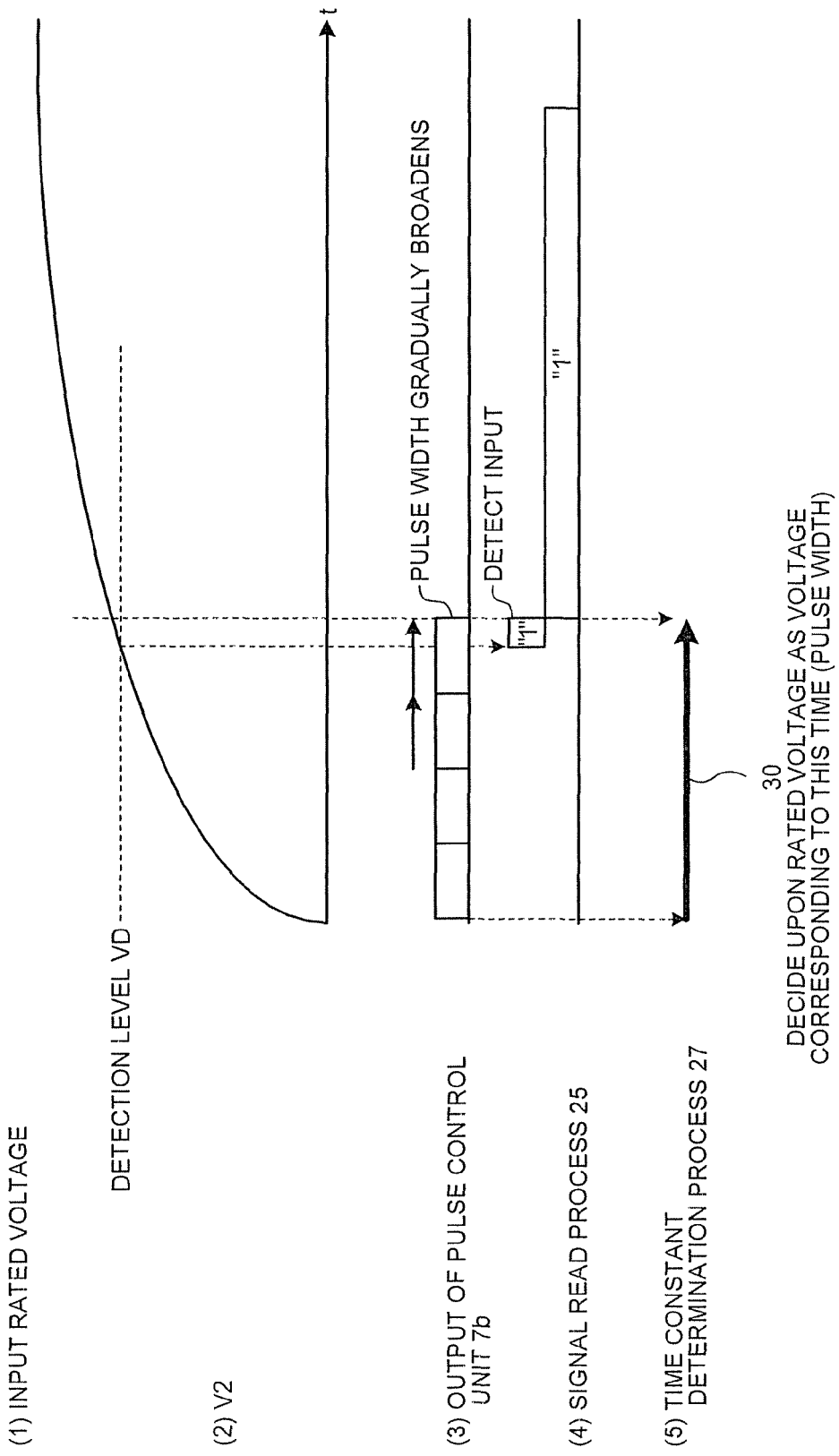
FIG. 7 is a timing chart of the operation of the digital signal input device shown in FIG. 6.
Figure 8:
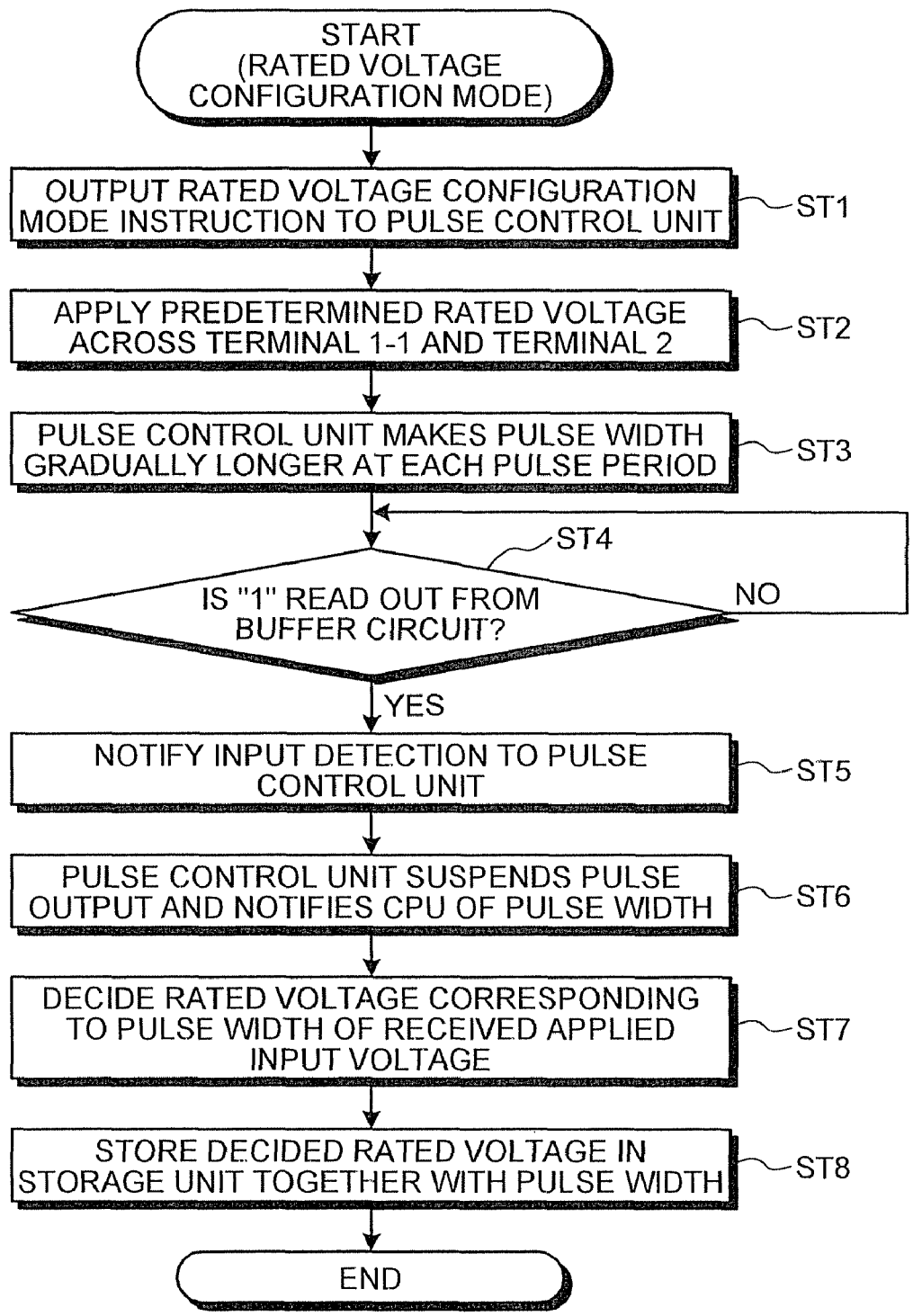
FIG. 8 is a flowchart of the operation of the digital signal input device shown in FIG. 6.

The following is a description of the operation of portions relating to the second embodiment in line with FIG. 8 with reference to FIGS. 6 and 7. FIG. 7 is a timing chart illustrating the operation of the digital signal input device shown in FIG. 6. FIG. 8 is a flowchart illustrating the operation of the digital signal input device shown in FIG. 6. In FIG. 7, FIG. 7 (2) shows the relationship between the terminal voltage V2 of the CR filter 12 and the detection level VD during the charging operation using the DC voltage (rated voltage) input in FIG. 7 (1). FIG. 7 (3) shows the operation of the pulse width of the pulse signal output by the pulse control unit 7b gradually being made longer. FIG. 7 (4) shows where the CPU 5b executes the signal read process 25 and performs a determination. FIG. 7 (5) shows an operation for deciding the rated voltage by the CPU 5b executing the time constant determination process 27. In FIG. 8, the steps indicating the processing procedure are shown simply abbreviated to ST.

In FIG. 8, in ST1, when the operation mode becomes the rated voltage configuration mode, the CPU 5b notifies the pulse control unit 7b of the rated voltage configuration mode instruction c. In step ST2, a predetermined rated voltage (for example, DC 110 volts) is applied across an arbitrary first input terminal (for example, the first input terminal 1-1) and the second input terminal 2 (FIG. 7 (1)).

In step ST3, upon receiving the rated voltage configuration mode instruction c from the CPU 5b, the pulse control unit 7b carries out processing to gradually make the pulse width of the pulse signal b output in the fixed period T longer in width units from a short pulse width at each pulse period T (FIG. 7 (3)).

In this process, as shown in FIG. 7 (2), at the CR filter 12, the charging voltage V2 that is the terminal voltage rises in the direction of the detection level VD (for example, 80 volts). When the detection level VD is exceeded, a digital signal of a logical value "1" is read-in and held by the signal receiving unit 16 on the trailing edge of the pulse signal b. A digital signal of a logical value of "1" is then written to the buffer circuit 4 on the trailing edge of the next pulse signal b. The small quadrangle-shape in FIG. 7 (4) is the pulse width made long this time at the pulse width for the previous time. At this timing, the charging voltage V2 exceeds the detection level VD. A situation is therefore shown where a digital signal of logical value "1" is written to the buffer circuit 4.

In ST4, after the pulse control unit 7b is notified of the rated voltage configuration mode instruction c, the CPU 5b executes the signal read process 25 and monitors the reading out of logical value "1" from the buffer circuit 4. As shown by the small quadrangle in FIG. 7 (4), when a digital signal of logical value "1" is read out from the buffer circuit 4 (ST4: Yes), in ST5, the CPU 5b notifies the pulse control unit 7b of the input detection d.

In step ST6, when the input detection notification d is received from the CPU 5b, the pulse control unit 7b stops the pulse output and the CPU 5b is notified of the total pulse width e subjected to extended processing.

A range 30 shown by a thick right-pointing arrow in FIG. 7 (5) denotes the time width for which the CPU 5b receives the pulse width e from the pulse control unit 7b. In step ST7, upon receiving notification of the pulse width e from the pulse control unit 7b, the CPU 5b executes the time constant determination process 27. A voltage corresponding to the received pulse width e is then obtained using Equation (1). The obtained voltage is the voltage applied to the input terminal and a rated voltage corresponding to the obtained voltage is decided. For example, if the obtained voltage is DC 111 volts, the rated voltage is decided as DC 110 volts. In ST8, the setting process 26 is executed and the decided rated voltage is stored in the storage unit 6 together with the pulse width e received from the pulse control unit 7b.

In the above, according to the second embodiment, it is possible to automatically set a rated voltage and a pulse width for the rated voltage by just applying a predetermined rated voltage across an arbitrary first input terminal and the second input terminal 2. It is therefore possible to set a rated voltage and a pulse width for the rated voltage more effectively than in the first embodiment.

Figure 9:
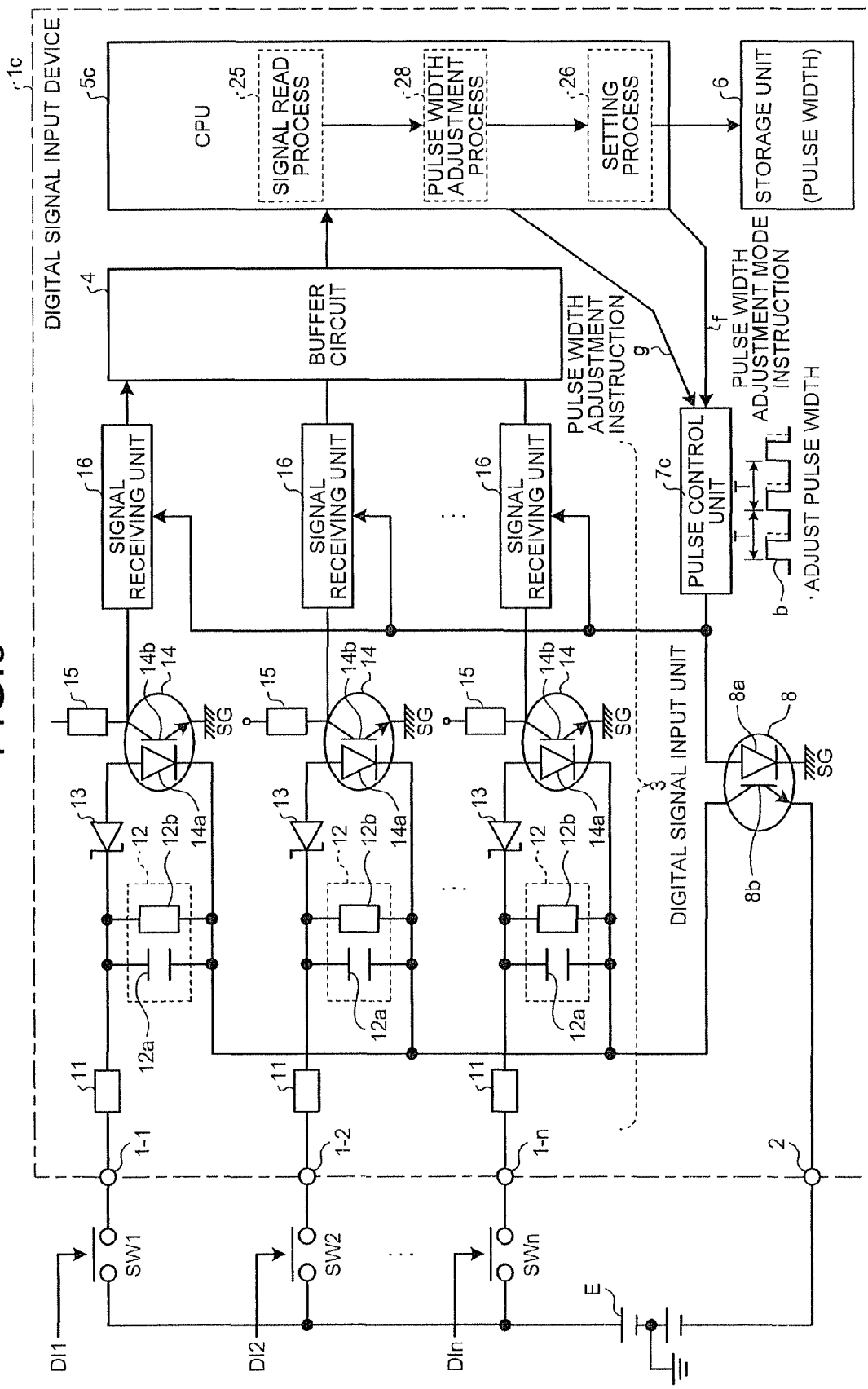
FIG. 9 is a block diagram of a digital signal input device according to a third embodiment of the present invention.

FIG. 9 is a block diagram of a digital signal input device according to a third embodiment of the present invention. In FIG. 9, elements of the configuration that are the same as or similar to elements of the configuration shown in FIG. 1 (the first embodiment) are given the same numerals. The explanation concentrates on portions relating to the third embodiment.

As shown in FIG. 9, a digital signal input device 1c of the third embodiment is the configuration shown in FIG. 1 (the first embodiment) with a CPU 5c provided in place of the CPU 5a and with a pulse control unit 7c provided in place of the pulse control unit 7a. A pulse width adjustment process 28 is added at the CPU 5c.

The third embodiment demonstrates countermeasures for adjusting pulse width with respect to individual errors of the capacitor 12a and the resistor 12b constituting the current-limiting resistor 11 and the CR filter 12 and with respect to fluctuations in detection level due to changes over time in the Zener diode 13 and the insulating photocoupler 14.

In addition to the normal operating mode, the CPU 5c includes a pulse width adjustment mode for adjusting the pulse width prior to shipping of the product. The pulse width adjustment process 28 is executed during the pulse width adjustment mode.

The pulse control unit 7c adjusts the pulse width of the pulse signal b output in the fixed period T according to a pulse width adjustment instruction g input by the CPU 5c within the period where the pulse width adjustment mode instruction f is input by the CPU 5c.

In theory, adjustment of the pulse width of the pulse signal b output by the pulse control unit 7c is carried out by comparing a difference between an measured time and a theoretical time required from application of a predetermined rated voltage across an arbitrary first input terminal and the second input terminal 2 until the signal receiving unit 16 outputs a digital signal of a certain logical value. The theoretical time is an existing time corresponding to an applied rated voltage, and a corresponding logical value can also be assumed.

However, in reality, it is judged whether pulse width adjustment is necessary using whether the obtained logical value (measured value) and the predetermined logical value (theoretical value) coincide. When there is a difference between the measured time and the theoretical time, a case of measured time<theoretical time, and a case of measured time>theoretical time exist for this magnitude relationship. When measured time<theoretical time, the pulse width of the pulse signal b output at the pulse control unit 7c is adjusted to be shorter. When the measured time>the theoretical time, the pulse width is adjusted to be longer.

It is then taken that, for example, as shown in FIG. 9, voltages where it is necessary to detect "voltage input present" and "no voltage input" required in the case where the DC power supply E takes a central point of two power supplies connected in series as earth is applicable to the DC voltage going to the digital signal input device used in the pulse width adjustment.

The requirements for a rated voltage of DC 220 volts are to detect "voltage input present" in a voltage range of DC 176 volts to DC 286 volts, and to always detect "no voltage input" for DC 286×½≈143 volts or less. In this case, DC 143 volts is the maximum voltage that has to be detected as "no voltage input". This is referred to as the "maximum non-detection voltage". Further, the DC 176 volts is the minimum voltage that has to be detected as "voltage input present". This is referred to as the "minimum detection voltage" to enable both to be distinguished.

The case where detection as "no voltage input" is necessary corresponds to when "measured time<theoretical time". The case where "no voltage input" cannot be detected and is detected as "voltage input present" is referred to as "erroneous detection". The case where detection as "voltage input present" is necessary corresponds to when "measured time>theoretical time". The case where "voltage input present" cannot be detected and is detected as "no voltage input" is referred to as "erroneous non-detection" to enable both types of detection to be distinguished.

These points are also the same when the rated voltage is DC 110 volts. The requirements for a rated voltage of DC 110 volts are to detect "voltage input present" in the voltage range of DC 88 volts to DC 143 volts and to always detect "no voltage input" for DC 143×½≈72 volts or less. The maximum non-detection voltage is therefore DC 72 volts and the minimum detection voltage is therefore DC 88 volts.

The cases where: (1) a maximum non-detection voltage is applied; (2) a minimum detection voltage is applied; and (3) a maximum non-detection voltage and a minimum detection voltage are both applied therefore exist for the DC voltage to the digital signal input device used for pulse width adjustment in the pulse width adjustment operation of the third embodiment. The following is an explanation of a pulse width adjustment operation of the third embodiment with reference in order to FIGS. 10 to 15.

Figure 10:
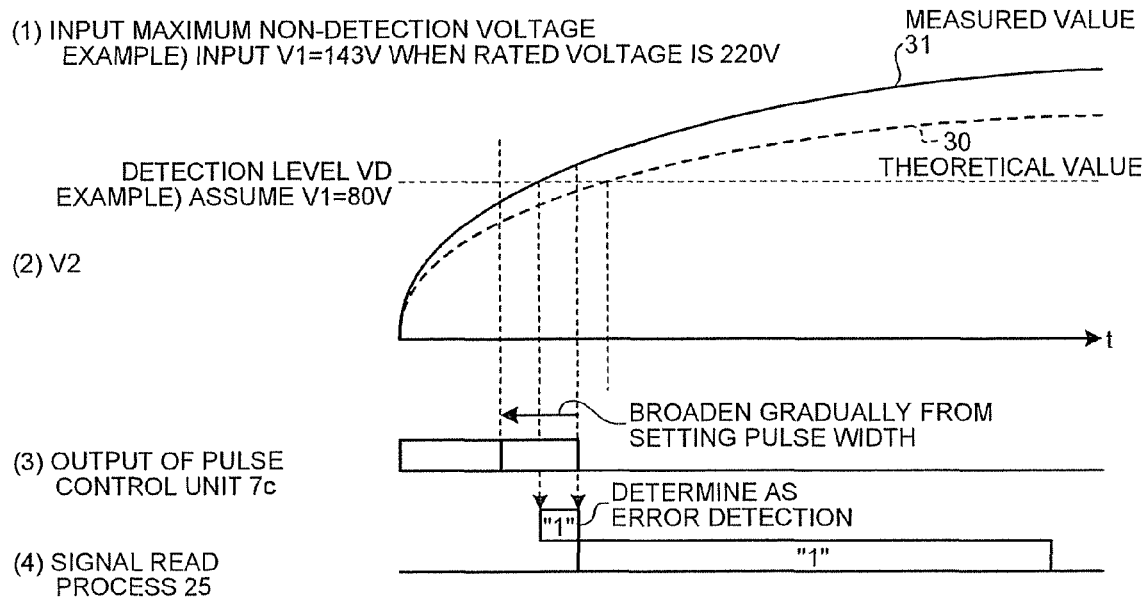
FIG. 10 is a timing chart explaining the pulse width adjustment operation when a maximum non-detection voltage is applied to the DC voltage to the digital signal input device shown in FIG. 9.

(1) FIG. 10 is a timing chart explaining the pulse width adjustment operation when a maximum non-detection voltage is applied to the DC voltage to the digital signal input device shown in FIG. 9. In FIG. 10, an example is shown of an operation where a maximum non-detection voltage of DC 143 volts is taken as the DC voltage when the rated voltage is DC 220 volts.

In FIG. 10, DC 143 volts at the rated voltage of DC 220 volts is applied as the maximum non-detection voltage across an arbitrary first input terminal and the second input terminal 2 (FIG. 10(1)). Upon entering pulse width adjustment mode, the CPU 5c notifies the pulse control unit 7c of the pulse width adjustment mode instruction f and the pulse width adjustment instruction g accompanying a correction pulse width decided for pulse width adjustment use. The pulse signal b of the fixed period T using the corrected pulse width is then output to the pulse control unit 7c.

When the input DC voltage V1 is, for example, DC 80 volts, the corrected pulse width is a time width required for the charging voltage V2 of the CR filter 12 to reach the detection level VD. For example, as shown in FIG. 10(2), the case is considered where the charging voltage V2 of the CR filter 12 at this correction pulse width rises in line with a measured curve 31 indicated by a solid line rising more rapidly than a theoretical curve 30 indicated by a dashed line and the measured time for the charging voltage V2 of the CR filter 12 to reach the detection level VD is shorter than the theoretical time.

In this case, the logical value for the digital signal latched by the signal receiving unit 16 should theoretically be "0". However, in reality, the logical value is "1". The signal read process 25 of the CPU 5c therefore cannot detect "no voltage input" and this is determined to be an erroneous input detection (FIG. 10(4)).

The pulse width adjustment process 28 of the CPU 5c notifies the pulse control unit 7c of the pulse width adjustment instruction g to make the pulse width shorter. Confirmation processing to determine whether "no voltage input" can be detected is then gone to again. The pulse control unit 7c that receives the pulse width adjustment instruction g then outputs the pulse signal b using a corrected pulse width that is a pulse width one adjustment width shorter.

In the pulse width adjustment process 28 for the CPU 5c, notification of a pulse width adjustment instruction g to make the pulse width shorter is repeated until detection of "no voltage input" is confirmed. The pulse control unit 7c makes the pulse width shorter one adjustment width at a time every time the pulse width adjustment instruction g is received (FIG. 10(3)). In this process, when the CPU 5c is capable of confirming detection of "no voltage present", the pulse width at the time of confirmation of detection of "no voltage input" obtained from the content of the pulse width adjustment instruction g notified until now is stored in the storage unit 6. The CPU 5c then ends the processing and withdraws the pulse width adjustment mode instruction f issued to the pulse control unit 7c.

When confirmation of detection of "no voltage input" is possible, the CPU 5c can also notify the pulse control unit 7c of the end of processing and acquire the pulse width at this time from the pulse control unit 7c for storage in the storage unit 6.

Figure 11:
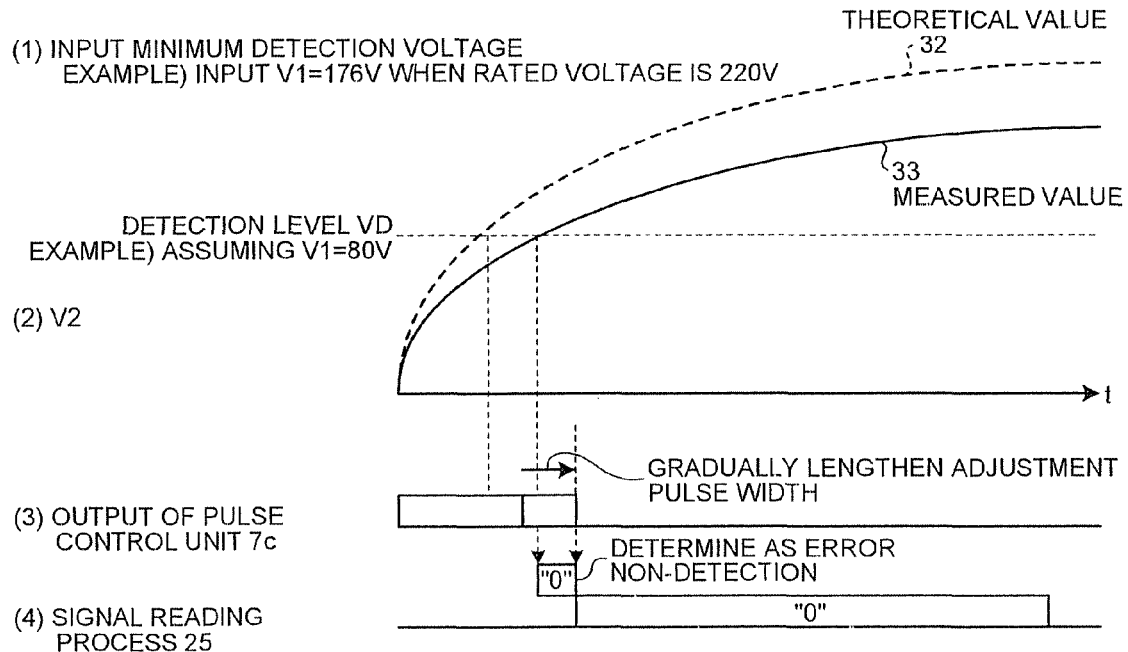
FIG. 11 is a timing chart explaining the pulse width adjustment operation when a minimum detection voltage is applied to the DC voltage to the digital signal input device shown in FIG. 9.

(2) FIG. 11 is a timing chart explaining the pulse width adjustment operation when a minimum detection voltage is applied to the DC voltage to the digital signal input device shown in FIG. 9. In FIG. 11, an example is shown of an operation where a minimum detection voltage of DC 176 volts is taken as the DC voltage when the rated voltage is DC 220 volts.

In FIG. 11, DC 176 volts at the rated voltage of DC 220 volts is applied as the minimum detection voltage across an arbitrary first input terminal and the second input terminal 2 (FIG. 11 (1)). Upon entering pulse width adjustment mode, the CPU 5c notifies the pulse control unit 7c of the pulse width adjustment mode instruction f and the pulse width adjustment instruction g accompanying a correction pulse width decided for pulse width adjustment use. A pulse signal b of a fixed period T using the corrected pulse width is then output to the pulse control unit 7c.

When the input DC voltage V1 is, for example, DC 80 volts, the corrected pulse width is a time width required for the charging voltage V2 of the CR filter 12 to reach the detection level VD. For example, as shown in FIG. 11 (2), the case is considered where the charging voltage V2 of the CR filter 12 at this correction pulse width rises in line with a measured curve 33 indicated by a solid line rising more slowly than a theoretical curve 32 indicated by a dashed line and the measured time for the charging voltage V2 of the CR filter 12 to reach the detection level VD is longer than the theoretical time.

In this case, the logical value for the digital signal latched by the signal receiving unit 16 should theoretically be "1". However, in reality, the logical value is "0". The signal read process 25 of the CPU 5c therefore cannot detect "voltage input present" and this is determined to be an erroneous input non-detection (FIG. 11 (4)).

The pulse width adjustment process 28 of the CPU 5c notifies the pulse control unit 7c of the pulse width adjustment instruction g to make the pulse width longer. Confirmation processing to determine whether "voltage input present" can be detected is then gone to again. The pulse control unit 7c that receives the pulse width adjustment instruction g then outputs the pulse signal b using a corrected pulse width that is a pulse width one adjustment width longer.

In the pulse width adjustment process 28 for the CPU 5c, output of a pulse width adjustment instruction g is repeated until detection of "voltage input present" is confirmed. The pulse control unit 7c makes the pulse width longer by one adjustment width at a time every time the pulse width adjustment instruction g is received (FIG. 10(3)). In this process, when the CPU 5c is capable of confirming detection of "voltage input present", the pulse width at the time of confirmation of detection of "voltage input present" obtained from the content of the pulse width adjustment instruction g notified up to this time is stored in the storage unit 6. The CPU 5c then ends the processing and withdraws the pulse width adjustment mode instruction f issued to the pulse control unit 7c.

When confirmation of detection of "voltage input present" is possible, the CPU 5c can also notify the pulse control unit 7c of the end of processing and acquire the pulse width at this time from the pulse control unit 7c for storage in the storage unit 6.

Figure 12:
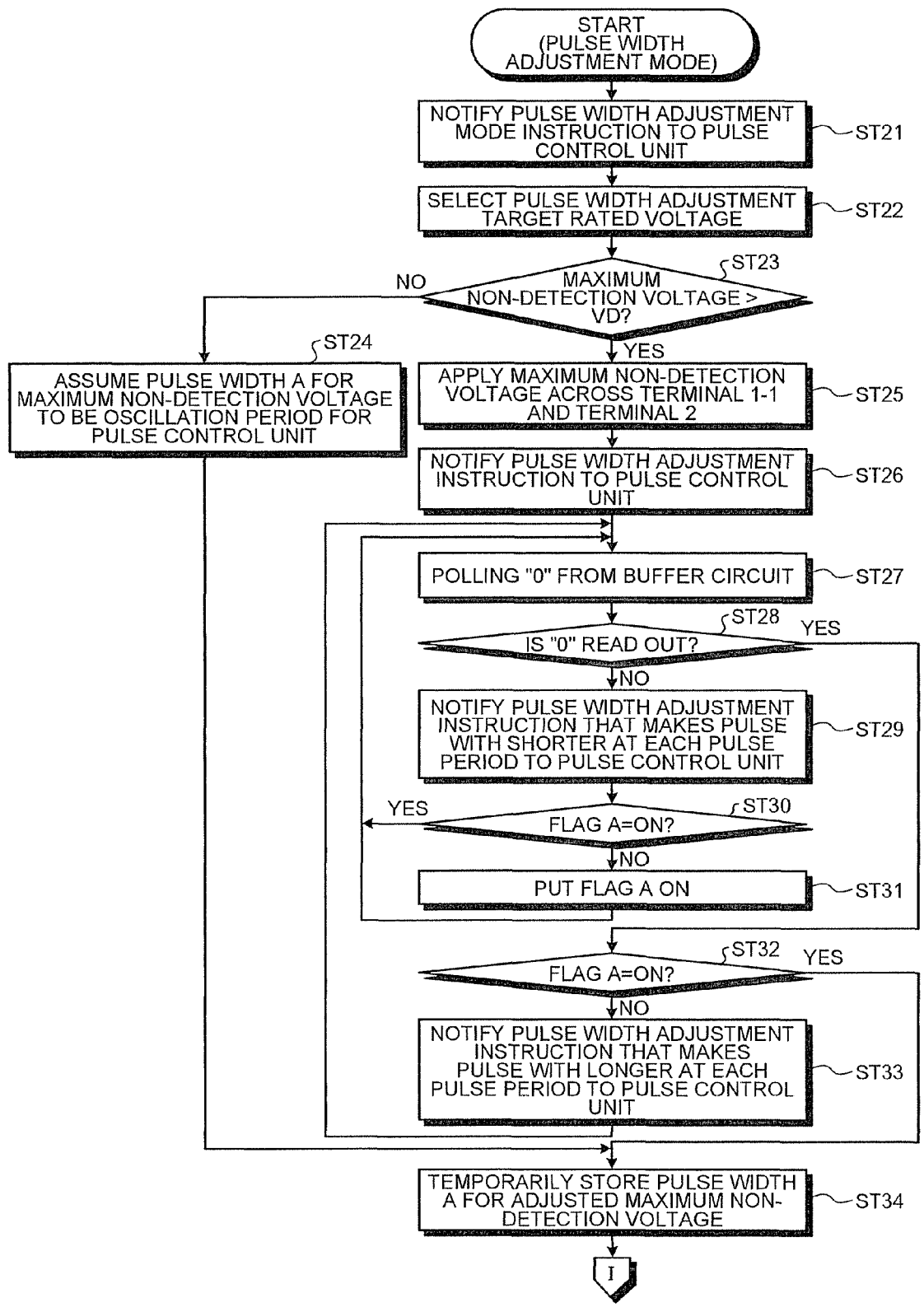
FIG. 12 is a flowchart (first part) explaining the pulse width adjustment operation when both a maximum non-detection voltage and a minimum detection voltage are applied to the DC voltage at the digital signal input device shown in FIG. 9.
Figure 13:
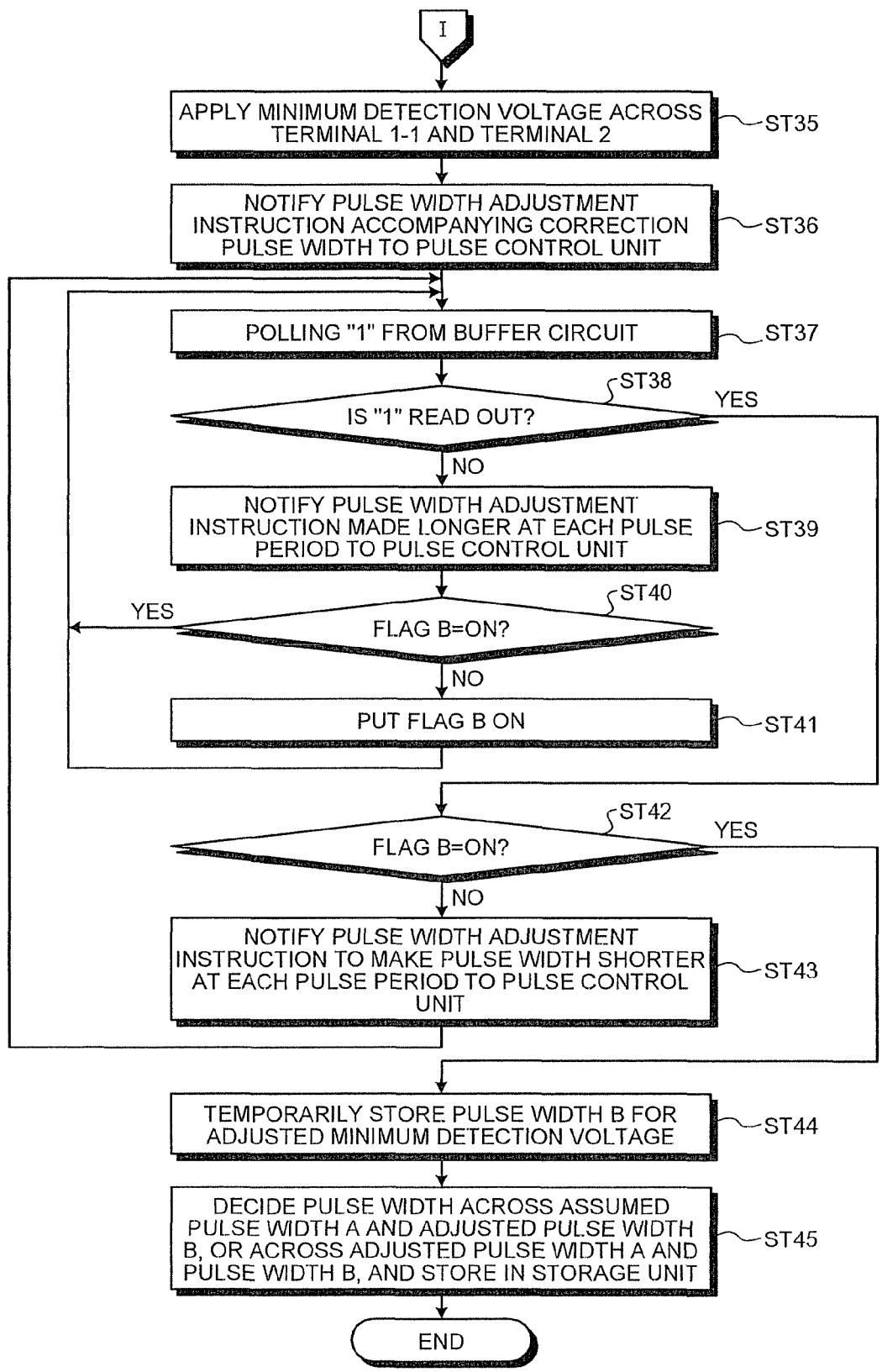
FIG. 13 is a flowchart (second part) explaining the pulse width adjustment operation when both a maximum non-detection voltage and a minimum detection voltage are applied to the DC voltage at the digital signal input device shown in FIG. 9.

(3) FIGS. 12 and 13 are flowcharts explaining the pulse width adjustment operation when both a maximum non-detection voltage and a minimum detection voltage are applied to the DC voltage at the digital signal input device shown in FIG. 9.

In FIG. 12, upon entering pulse width adjustment mode, the CPU 5c outputs a pulse width adjustment mode instruction f to the pulse control unit 7c (ST21) and selects a pulse width adjustment target rated voltage (ST22). An explanation is given where a maximum non-detection voltage is then input first, after which a minimum detection voltage is input.

First, when a maximum non-detection voltage is selected as input, it is determined whether the maximum non-detection voltage exceeds the detection level VD (ST23). As a result, when the maximum non-detection voltage does not exceed the detection level VD (ST23: No), a pulse width A for the maximum non-detection voltage is assumed to be a time width corresponding to an oscillation period (pulse period T) for the pulse control unit 7c (ST24), and ST34 is proceeded to. In ST 34, the CPU 5c temporarily stores the assumed pulse width A. The CPU 5c then proceeds to the pulse width adjustment processing using the minimum detection voltage shown in FIG. 13.

When the result of the determination in ST 23 is that the maximum non-detection voltage exceeds the detection level VD (ST23: Yes), the maximum non-detection voltage is applied across, for example, the first input terminal 1-1 taken as an arbitrary input terminal and the second input terminal 2 (ST25). The pulse control unit 7c is then notified of the pulse width adjustment instruction g accompanying the corrected pulse width (ST26). Reading of a digital signal of a logical value "0" indicating "no input voltage" from the buffer circuit 4 is then monitored (ST27).

When the result of the observation in ST27 is that a digital signal of a logical value "0" is read out from the buffer circuit 4 (ST28: Yes), the state of a flag A used in pulse width control during input of the maximum non-detection voltage is confirmed (ST32). The flag A is initially not set to "on" (ST32: No). The pulse control unit 7c is therefore notified of a pulse width adjustment instruction g to make a corrected pulse width longer by just one adjustment width (ST33) and ST27 is first returned to.

When the result of the observation in ST27 is that a logical value of a digital signal read out from the buffer circuit 4 the second time is "0" (ST28: Yes), the flag A is also not on this occasion (ST32: No). The pulse control unit 7c is then notified of a pulse width adjustment instruction g that is to make the pulse width that was just made longer one adjustment width longer (ST33) and ST27 is returned to. Thereafter, while a digital signal of a logical value "0" is read out from the buffer circuit 4 (ST28: Yes), the processing of ST33 is then repeated, and the pulse width is made longer one adjustment width at a time.

When a digital signal of a logical value "0" is no longer read out from the buffer circuit 4 (ST28: No), the pulse control unit 7c is notified of a pulse width adjustment instruction g to make the pulse width that was just made one adjustment width at a time longer from the correction pulse width shorter by just one adjustment width (ST29) and the state of flag A is confirmed (ST30). When the flag A is not on (ST30: No), the flag A is put on (ST31) and ST27 is returned to.

When the result of the observation in ST27 is that a logical value of a digital signal read out from the buffer circuit 4 is not "0" (ST28: No), the pulse control unit 7c is then notified of a pulse width adjustment instruction g that is to make the pulse width that was just made shorter one adjustment width shorter (ST29) and the state of the flag A is confirmed (ST30). The flag A is set to on at this time (ST30: Yes) and ST27 is returned to directly. Thereafter, for as long as a digital signal of a logical value "0" is read out from the buffer circuit 4 (ST28: No) the processing of ST29 is repeated, and the pulse width is made shorter one adjustment width at a time.

When a digital signal of a logical value "0" is read out from the buffer circuit 4 (ST28: Yes), the state of a flag A is confirmed (ST32). The flag A is set to on (ST32: Yes) and ST34 is proceeded to. In step ST34, the CPU 5c temporarily makes the correction pulse width longer one adjustment width at a time. The pulse width A for the maximum non-detection voltage adjusted so as to be made shorter one adjustment width at a time is then temporarily stored. The CPU 5*c* then proceeds to the pulse width adjustment processing using the minimum detection voltage shown in FIG. 13.

In FIG. 13, the CPU 5*c* applies the minimum detection voltage across the first input terminal 1-1 and the second input terminal 2 (ST35). The pulse control unit 7*c* is then notified of the pulse width adjustment instruction g in accompaniment with the correction pulse width (ST36). The pulse control unit 7*c* the resets the pulse width used previously and starts pulse oscillation using the correction pulse width instructed on this occasion.

The CPU 5*c* then observes the reading out of a digital signal of a logical value "1" indicating "voltage input present" from the buffer circuit 4 (ST37). When the result of the observation in ST37 is that a logical value of a digital signal read out from the buffer circuit 4 is not "1" (ST38: No), the pulse control unit 7*c* is then notified of a pulse width adjustment instruction g that is to make the correction pulse width one adjustment width longer (ST39). The state of the flag B used in the pulse width adjustment control when inputting the minimum detection voltage is then confirmed (ST40). The flag B is therefore initially not set to on (ST40: No). The flag B is therefore put on (ST41) and ST37 is returned to.

When the result of the observation in ST37 is that a logical value of a digital signal read out from the buffer circuit 4 the second time is not "1" (ST38: No), the pulse control unit 7*c* is then notified of a pulse width adjustment instruction g that is to make the pulse width that was just made longer one adjustment width longer (ST39) and the state of the flag B is confirmed (ST40). The flag B is set to on at this time (ST40: Yes) and ST37 is returned to directly. Thereafter, for as long as a digital signal of a logical value "1" is read out from the buffer circuit 4 (ST38: No), the processing of ST39 is repeated, and the pulse width is made longer one adjustment width at a time.

Further, when the results of observation in ST37 directly after seeing of the correction pulse width at the pulse control unit 7*c* in ST36 are read out as the digital signal of a logical value "1" from the buffer circuit 4 (ST38: Yes), the state of the flag B is confirmed (ST42). The flag B is initially not set to "on" (ST42: No). The pulse control unit 7*c* is therefore notified of a pulse width adjustment instruction g to make a corrected pulse width shorter by just one adjustment width (ST43) and ST37 is first returned to.

When the result of the observation in ST37 is that a logical value of a digital signal read out from the buffer circuit 4 the second time is "1" (ST38: Yes), the flag B is also not on at this time (ST42: No). The pulse control unit 7*c* is then notified of a pulse width adjustment instruction g that is to make the pulse width that was just made shorter one adjustment width shorter (ST43) and ST37 is returned to. Thereafter, while a digital signal of a logical value "1" is read out from the buffer circuit 4 (ST38: Yes), the processing of ST43 is repeated, and the pulse width is made shorter one adjustment width at a time.

When a digital signal of a logical value "1" is no longer read out from the buffer circuit 4 (ST38: No), the pulse control unit 7*c* is notified of a pulse width adjustment instruction g to make the pulse width that was just made one adjustment width at a time shorter from the correction pulse width longer by just one adjustment width (ST39). The flag B is therefore not on (ST40: No). The flag B is therefore put on (ST41) and ST37 is returned to. Thereafter, while a digital signal of a logical value "1" is not read out from the buffer circuit 4 (ST38: No) the processing of ST39 is repeated, and the pulse width is made longer one adjustment width at a time.

When a digital signal of a logical value "1" is read out from the buffer circuit 4 (ST38: Yes), the state of a flag B is confirmed (ST42). When the flag B is set to on (ST42: Yes), the CPU 5*c* temporarily makes the correction pulse width shorter one adjustment width at a time. The pulse width B for the minimum detection voltage adjusted so as to be made longer one adjustment width at a time is then temporarily stored (ST44) and ST45 is proceeded to.

In ST45, the CPU 5*c* decides a pulse width for between the oscillation period of the pulse control unit 7*c* (one pulse period T), the assumed pulse width A, and the pulse width B acquired through adjustment, or between the pulse width A acquired through adjustment and the pulse width B and stores the pulse widths in the storage unit 6. A straightforward deciding method exists where, as in the example explained above, pulse width A>pulse width B. Then, for example, an operation of dividing pulse width B+(pulse width A−pulse width B) by two is carried out. The pulse width is then decided as (pulse width A+pulse width B)/2. The CPU 5*c* the ends the processing of this procedure and withdraws the pulse width adjustment mode instruction f being notified to the pulse control unit 7*c*.

Figure 14:
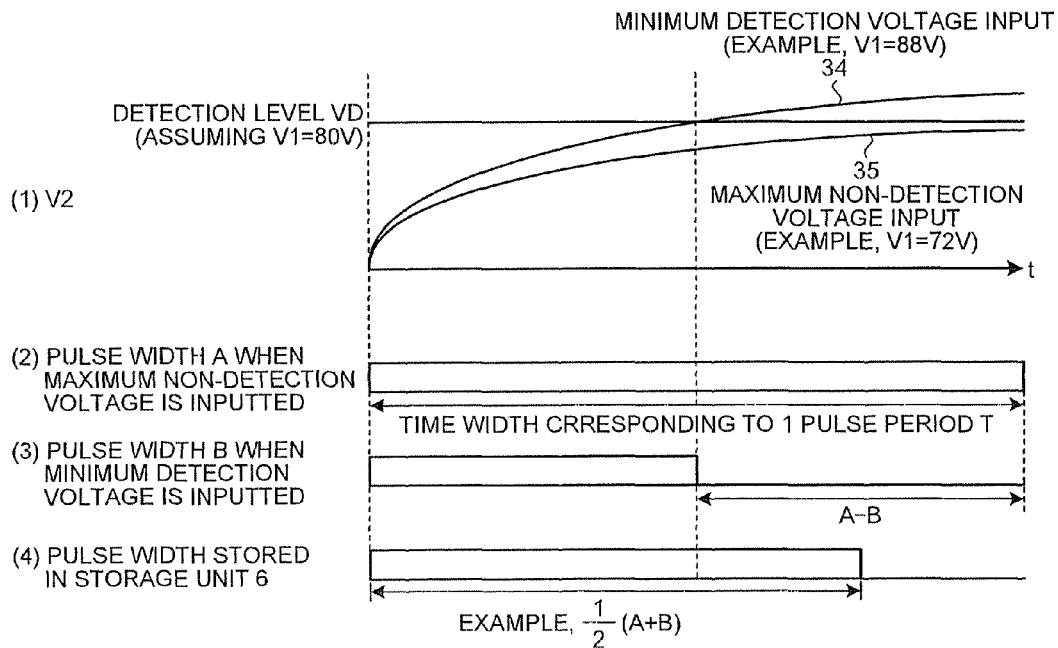
FIG. 14 is a timing chart explaining an operation for deciding an oscillation period and a pulse width for between the assumed pulse width A and the pulse width B obtained by adjustment for the pulse control unit in FIGS. 12 and 13.
Figure 15:
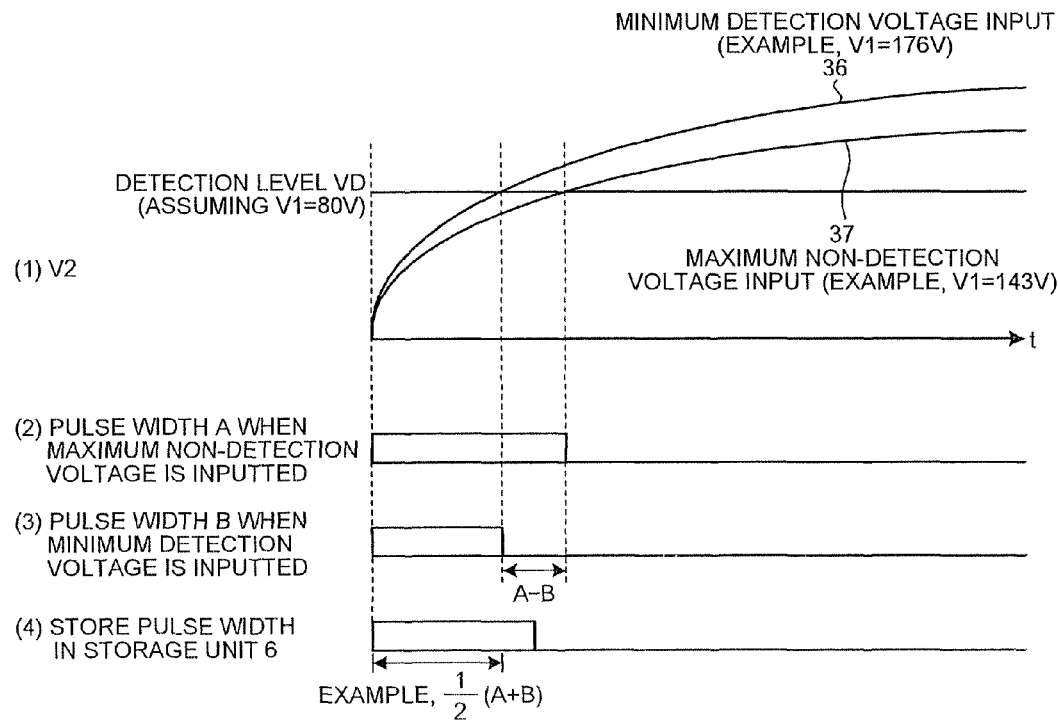
FIG. 15 is a timing chart explaining deciding of a pulse width between the pulse width A obtained by adjustment and the pulse width B in FIGS. 12 and 13.

Next, with reference to FIGS. 14 and 15, a description is given of specific examples of two types of pulse width acquiring operation obtained from the processing procedure explained above. FIG. 14 is a timing chart explaining an operation for deciding a pulse width from the pulse width A assumed to be the oscillation period T of the pulse control unit 7*c* and the pulse width B obtained by adjustment in FIGS. 12 and 13. FIG. 15 is a timing chart explaining an operation for deciding a pulse width from the pulse width A and the pulse width B both obtained by adjustment in FIGS. 12 and 13.

An example of the operation when the rated voltage is DC 110 volts is shown in FIG. 14. The maximum non-detection voltage in this case is DC 72 volts and the minimum detection voltage is DC 88 volts. As shown in FIG. 14, the detection level VD is, for example, V1=80 volts.

First, the maximum non-detection voltage (DC 72 volts) is input as the DC voltage V1. This means that even if a pulse signal b of a fixed period T is output to the pulse control unit 7*c*, the maximum non-detection voltage (DC 72 volts) is less than or equal to the detection level VD (DC 80 volts). The terminal voltage V2 of the CR filter 12 then does not exceed the detection level VD (DC 80 volts) within the period for one pulse period T, as with a charging characteristic curve 35 shown in FIG. 14 (1).

In ST22 in FIG. 12, the relationship of the magnitude of the maximum non-detection voltage input and the detection level VD is compared without operation actually taking place. When the maximum non-detection voltage<the detection level VD, in ST23 of FIG. 12, a time width corresponding to an oscillation period (one pulse period T) of the pulse control unit 7*c* is assumed to be the pulse width A when inputting the maximum non-detection voltage (DC 72 volts) (FIG. 14 (2)).

Next, the minimum detection voltage (DC 88 volts) is input as the DC voltage V1. When a pulse signal b of a fixed period T is the output to the pulse control unit 7*c* (ST35, ST36), the minimum detection voltage is greater than the detection level VD. The terminal voltage V2 of the CR filter 12 then exceeds the detection level VD (DC 80 volts) within the period for one pulse period T, as with a charging characteristic curve 34 shown in FIG. 14 (1).

Processing making the pulse width longer one adjustment width at a time is then carried out at the pulse control unit 7*c* (ST37-ST38-ST39-ST40-ST41-St37) until the charging characteristic curve 34 exceeds the detection level VD (ST38: No) to find the point of intersection of the charging characteristic curve 34 and the detection level VD. When the charging characteristic curve 34 exceeds the detection level VD (ST38: Yes), the pulse width is shortened one adjustment width at a time at the pulse control unit 7c (ST43-ST37-ST38-ST43). When the charging characteristic curve 34 falls below the detection level VD (ST38: No), the pulse width is again lengthened one adjustment width at a time at the pulse control unit 7c (ST37-ST38-ST39-ST40-ST41-ST37). In this process, when the charging characteristic curve 34 exceeds the detection level VD (ST38: Yes) and flag B=on (ST42: Yes), the pulse width output to the pulse control unit 7c at this time is then stored as the pulse width B at the time of input of the minimum detection voltage (DC 88 volts) (FIG. 14 (3)).

The pulse width when the rated voltage DC 110 volts is the DC voltage V1 is, for example, decided as (A+B)/2 by adding (pulse width A-Pulse width B)/2 to the pulse width B (FIG. 14 (4)).

An example of the operation when the rated voltage is DC 220 volts is shown in FIG. 15. The maximum non-detection voltage in this case is DC 143 volts and the minimum detection voltage is DC 176 volts. As shown in FIG. 15, the detection level VD is, for example, V1=80 volts.

First, the maximum non-detection voltage>the detection level VD (ST23: Yes). The maximum non-detection voltage (DC 143 volts) is then input as the DC voltage V1. When a pulse signal b of a fixed period T is then output at the pulse control unit 7c (ST25, ST26), the terminal voltage V2 of the CR filter 12 exceeds the detection level VD (DC 80 volts) within the period for one pulse period T, as shown by a charging characteristic curve 37 shown in FIG. 15 (1).

Processing making the pulse width longer one adjustment width at a time is then carried out at the pulse control unit 7c (ST33-ST27-ST28-ST32-ST33) until the charging characteristic curve 37 exceeds the detection level VD (ST28: Yes) in order to find the point of intersection of the charging characteristic curve 37 and the detection level VD. When the charging characteristic curve 37 exceeds the detection level VD (ST28: No), the pulse width is shortened one adjustment width at a time at the pulse control unit 7c (ST29-ST30-ST31-ST27-ST28-ST29). In this process, when the charging characteristic curve 37 falls below the detection level VD (ST28: Yes), and flag A=on (ST32: Yes), the pulse width output to the pulse control unit 7c at this time is then stored as the pulse width A at the time of input of the maximum non-detection voltage (DC 143 volts) (FIG. 15 (2)).

Next, the minimum detection voltage (DC 176 volts) is input as the DC voltage V1. When a pulse signal b of a fixed period T is the output to the pulse control unit 7c (ST35, ST36), the minimum detection voltage is greater than the detection level VD. The terminal voltage V2 of the CR filter 12 then exceeds the detection level VD (DC 80 volts) within the period for one pulse period T, as shown by a charging characteristic curve 36 shown in FIG. 15 (1).

The operation for finding the point of intersection of the charging characteristic curve 36 and the detection level VD is executed using the same procedure as when inputting the minimum detection voltage in FIG. 14. In ST42, when flag B=on (ST42: Yes), the pulse width output to the pulse control unit 7c at this time is temporarily stored as the pulse width B for the time of inputting the minimum detection voltage (DC 176 volts) (FIG. 15 (3)).

The pulse width when the rated voltage DC 220 volts is the DC voltage V1 is, for example, decided as (A+B)/2 by adding (pulse width A-Pulse width B)/2 to the pulse width B (FIG. 15 (4)).

According to the third embodiment, a pulse width adjusting function is provided that is capable of acquiring and resetting appropriate pulse widths even when charging and discharging voltage levels of the CR filter 12 and detection levels fluctuate as a result of characteristic errors and deterioration of time of the current-limiting resistor 11, the CR filter 12, the Zener diode 13 and the insulating photocoupler 14. It is therefore possible to prevent erroneous detection and erroneous non-detection.

In the third embodiment, an explanation is given using DC 220 volts and DC 110 volts as the rated voltages. However, in reality, the maximum non-detection voltage, minimum detection voltage, and operating region are based on the specifications for the electrical station and on customer requirements and can therefore be different to the values explained above. Further, an explanation is given where the maximum non-detection voltage and the minimum detection voltage are common, i.e. common for the two types of rated voltage but being common for three or more rated voltages is also possible.

Moreover, in the first to third embodiments, the case where many kinds of DC control voltages are input in the field of electrical power is explained. However, the present invention is not limited in this respect, and is similarly applicable to cases where a central point of a power supply is not connected to earth, sequencers handling the input of typical alternating current signals, or the field of programmable control, etc.

According to an aspect of the present invention, the heat generation can be under control for various types of DC voltages with input circuits of the same configuration, and at the same time, a digital signal input device capable of converting the various types of DC voltages into appropriate digital signals can be realized.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A digital signal input device having a first input terminal, a second input terminal, a charging circuit, and a digital signal detection unit, a direct-current voltage being applied across the first input terminal and the second input terminal, the charging circuit being connected between the first input terminal and the second input terminal, the digital signal detection unit detecting a level of a charging voltage of the charging circuit and outputting a digital signal of a logical value according to whether the level of the charging voltage exceeds a predetermined level to an internal circuit, the digital signal input device comprising:
   a pulse control unit that outputs a pulse signal having a fixed period using a designated pulse width and a designated pulse period; and
   a switching element that is provided between the charging circuit and either one of the first input terminal and the second input terminal, and that controls a period of applying the direct-current voltage to the charging circuit using a pulse width of the pulse signal.

2. The digital signal input device according to claim 1, further comprising:
   a storage unit that stores therein in advance a pulse width and a pulse period calculated from a correlation between a time constant of the charging circuit and the predetermined level, for an applied direct-current voltage; and
   a management unit that reads out the pulse width and the pulse period from the storage unit for the direct-current voltage applied across the first input terminal and the second input terminal, and provides the pulse width and the pulse period to the pulse control unit.

3. A digital signal input device having a first input terminal, a second input terminal, a charging circuit, and a digital signal detection unit, a direct-current voltage being applied across the first input terminal and the second input terminal, the charging circuit being connected between the first input terminal and the second input terminal, the digital signal detection unit detecting a level of a charging voltage of the charging circuit and outputting a digital signal of a logical value according to whether the level of the charging voltage exceeds a predetermined level to an internal circuit, the digital signal input device comprising:

a pulse control unit that performs, upon receiving a voltage configuration mode instruction, a processing to broaden a pulse width of a pulse signal output in a fixed period by a unit width at each pulse period, and upon receiving a notification of input detection, outputs a pulse signal having a pulse width adjusted until the notification of input detection is received;

a switching element that is provided between the charging circuit and either one of the first input terminal and the second input terminal, and that controls a period of applying the direct-current voltage to the charging circuit using a pulse width of the pulse signal;

a signal receiving unit that reads in an output of the digital signal detection unit in response to the pulse signal input in a fixed period and holds an output pulse for one pulse period; and a management unit that issues the notification of input detection when a digital signal of a logical value predetermined by the signal receiving unit is held, calculates a voltage value corresponding to the pulse width notified by the pulse control unit based on a time constant of the charging circuit, and stores the voltage value in the storage unit.

4. A digital signal input device having a first input terminal, a second input terminal, a charging circuit, and a digital signal detection unit, a direct-current voltage being applied across the first input terminal and the second input terminal, the charging circuit being connected between the first input terminal and the second input terminal, the digital signal detection unit detecting a level of a charging voltage of the charging circuit and outputting a digital signal of a logical value according to whether the level of the charging voltage exceeds a predetermined level to an internal circuit, the digital signal input device comprising:

a pulse control unit that outputs, upon receiving a pulse width adjustment mode instruction, a pulse signal output in a fixed period having a pulse width adjusted according to the pulse width adjustment instruction;

a switching element that is provided between the charging circuit and either one of the first input terminal and the second input terminal, and that controls a period of applying the direct-current voltage to the charging circuit using a pulse width of the pulse signal;

a signal receiving unit that reads in an output of the digital signal detection unit in response to the pulse signal input in a fixed period and holds an output pulse for one pulse period; and a management unit that repeatedly issues, when a logical value of a digital signal held by the signal receiving unit is not a logical value predetermined for the direct-current voltage applied across the first input terminal and the second input terminal, the pulse width adjustment instruction in which an adjustment width is specified until the digital signal of the predetermined logical value is held by the signal receiving unit, and when holding of the digital signal of the predetermined logical value is confirmed, stores the pulse width in the storage unit.

5. The digital signal input device according to claim 4, wherein the management unit decides the pulse width between a first and a second pulse widths acquired through adjustment of a first and a second direct-current voltages applied across the first input terminal and the second input terminal, and stores the pulse width in the storage unit.

6. A control method for a digital signal input device having a first input terminal, a second input terminal, a charging circuit, and a digital signal detection unit, a direct-current voltage being applied across the first input terminal and the second input terminal, the charging circuit being connected between the first input terminal and the second input terminal, the digital signal detection unit detecting a level of a charging voltage of the charging circuit and outputting a digital signal of a logical value according to whether the level of the charging voltage exceeds a predetermined level to an internal circuit, the control method comprising:

storing in advance a pulse width and a pulse period calculated from a correlation between a time constant of the charging circuit and the predetermined level, for an applied direct-current voltage in a storage unit;

reading out the pulse width and the pulse period from the storage unit for the direct-current voltage applied across the first input terminal and the second input terminal;

outputting a pulse signal having a fixed period using the pulse width and the pulse period read at the reading; and controlling a period of applying the direct-current voltage to the charging circuit using a pulse width of the pulse signal.

7. A control method for a digital signal input device having a first input terminal, a second input terminal, a charging circuit, and a digital signal detection unit, a direct-current voltage being applied across the first input terminal and the second input terminal, the charging circuit being connected between the first input terminal and the second input terminal, the digital signal detection unit detecting a level of a charging voltage of the charging circuit and outputting a digital signal of a logical value according to whether the level of the charging voltage exceeds a predetermined level to an internal circuit, the control method comprising:

executing a processing to broaden a pulse width of a pulse signal output in a fixed period by a unit width at each pulse period until an input of a digital signal of a predetermined logical value is detected in a voltage configuration mode;

controlling a period of applying the direct-current voltage to the charging circuit using a pulse width of the pulse signal;

reading in an output of the digital signal detection unit in response to the pulse signal input;

holding an output pulse for one pulse period;

detecting the input of the digital signal when the digital signal of the logical value predetermined at the reading is held;

acquiring the pulse width processed at the executing;

calculating a voltage value corresponding to the pulse width acquired at the acquiring based on the time constant of the charging circuit; and storing the voltage value in a storage unit.

8. A control method for a digital signal input device having a first input terminal, a second input terminal, a charging circuit, and a digital signal detection unit, a direct-current voltage being applied across the first input terminal and the second input terminal, the charging circuit being connected between the first input terminal and the second input terminal, the digital signal detection unit detecting a level of a charging voltage of the charging circuit and outputting a digital signal of a logical value according to whether the level of the charging voltage exceeds a predetermined level to an internal circuit, the control method comprising:

applying a predetermined direct-current voltage across the first input terminal and the second input terminal;

outputting a pulse width adjustment instruction in which a correction pulse width is specified in a pulse width adjustment mode;

outputting a pulse signal output in a fixed period having a pulse width adjusted according to the pulse width adjustment instruction;

controlling a period of applying the direct-current voltage to the charging circuit using a pulse width of the pulse signal;

reading in an output of the digital signal detection unit in response to the pulse signal input in a fixed period;

holding an output pulse for one pulse period;

determining whether a logical value of a digital signal held at the holding is a logical value predetermined for the direct-current voltage applied across the first input terminal and the second input terminal;

issuing repeatedly, when the logical value of the digital signal held at the holding is not a logical value predetermined for the direct-current voltage applied across the first input terminal and the second input terminal, the pulse width adjustment instruction in which an adjustment width is specified until the digital signal of the predetermined logical value is held at the holding; and storing the pulse width in the storage unit when holding of the digital signal of the predetermined logical value is confirmed.

9. The method of controlling the digital signal input device according to claim 8, wherein the predetermined direct-current voltage includes a first direct-current voltage and a second direct-current voltage, the issuing includes deciding the pulse width between a first and a second pulse widths acquired through adjustment of a first and a second direct-current voltages applied across the first input terminal and the second input terminal.

* * * * *